United States Patent
Lee et al.

(10) Patent No.: US 12,176,382 B2
(45) Date of Patent: Dec. 24, 2024

(54) LIGHT-EMITTING DISPLAY DEVICE

(71) Applicant: LG Display Co., Ltd., Seoul (KR)

(72) Inventors: Nayoung Lee, Paju-si (KR); Yonghoon Choi, Paju-si (KR); Soyoung Jo, Paju-si (KR); Mingeun Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 434 days.

(21) Appl. No.: 17/545,617

(22) Filed: Dec. 8, 2021

(65) Prior Publication Data

US 2022/0199681 A1    Jun. 23, 2022

(30) Foreign Application Priority Data

Dec. 22, 2020    (KR) .................. 10-2020-0180729

(51) Int. Cl.
    *H01L 27/15*    (2006.01)
    *H01L 33/38*    (2010.01)
    *H01L 33/50*    (2010.01)

(52) U.S. Cl.
    CPC ............ *H01L 27/156* (2013.01); *H01L 33/38* (2013.01); *H01L 33/50* (2013.01)

(58) Field of Classification Search
    CPC ....... H01L 27/156; H01L 33/38; H01L 33/50; H10K 50/856; H10K 2102/351; H10K 50/85; H10K 50/826; H10K 50/813; H10K 50/822; H10K 59/124; H10K 59/12; H10K 50/858; H10K 59/38
    See application file for complete search history.

(56) References Cited

U.S. PATENT DOCUMENTS

| 2019/0393448 | A1* | 12/2019 | Choi ................ H10K 50/856 |
| 2020/0058721 | A1  | 2/2020  | Sim et al. |

FOREIGN PATENT DOCUMENTS

| EP | 2 704 527 A1 | 3/2014 |
| EP | 3 367 457 A1 | 8/2018 |
| EP | 3 618 122 A1 | 3/2020 |
| KR | 10-2019-0080055 A | 7/2019 |
| WO | 2019/151278 A1 | 8/2019 |

OTHER PUBLICATIONS

Extended European Search Report from the European Patent Office dated Jun. 10, 2022 in counterpart European Patent Application No. 21216966.8.

* cited by examiner

*Primary Examiner* — Mohammad A Rahman
(74) *Attorney, Agent, or Firm* — Morgan, Lewis & Bockius LLP

(57) ABSTRACT

A light-emitting display device includes: a substrate, a plurality of pixels on the substrate, each pixel including an opening area, a light extraction pattern disposed in each opening area, the light extraction pattern including: a plurality of concave portions spaced apart from each other, and a protruding portion surrounding each of the plurality of concave portions, and a light-emitting device layer including: a light-emitting layer over the light extraction pattern, and a non-emission area overlapping a top portion of the protruding portion between the two adjacent concave portions.

20 Claims, 8 Drawing Sheets

LIGHT-EMITTING DISPLAY DEVICE

CROSS-REFERENCE TO RELATED APPLICATION(S)

This application claims the benefit of and priority to Korean Patent Application No. 10-2020-0180729, filed on Dec. 22, 2020, the entirety of which is hereby incorporated by reference.

BACKGROUND

1. Technical Field

The present disclosure relates to a light-emitting display device.

2. Discussion of the Related Art

Because a light-emitting display device has a high response speed and low power consumption, and spontaneously emits light without using a particular light source, unlike a liquid crystal display device, the light-emitting display device does not cause a problem in a viewing angle. Thus, the light-emitting display device attracts attention as a next-generation flat panel display device.

A light-emitting display device displays an image by emission of light from light-emitting elements, including a light-emitting layer interposed between two electrodes. In this case, light generated by emission of light from the light-emitting elements is externally discharged through the electrodes, a substrate, and the like.

However, in such a light-emitting display device, some light of light emitted from a light-emitting layer is not externally discharged, due to total reflection or the like, at an interface between the light-emitting layer and an electrode and/or an interface between the substrate and an air layer. Thus, light extraction efficiency decreases. Accordingly, a light-emitting display device has a problem in that luminance decreases and power consumption increases due to low light extraction efficiency.

SUMMARY

Accordingly, the present disclosure is directed to a light-emitting display device that substantially obviates one or more of the issues due to limitations and disadvantages of the related art.

An aspect of the present disclosure is to provide a light-emitting display device that can enhance light extraction efficiency of light that is emitted from a light-emitting element.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, there is provided a light-emitting display device, including: a substrate, a plurality of pixels on the substrate, each pixel including an opening area, a light extraction pattern disposed in each opening area, the light extraction pattern including: a plurality of concave portions spaced apart from each other, and a protruding portion surrounding each of the plurality of concave portions, and a light-emitting device layer including: a light-emitting layer over the light extraction pattern, and a non-emission area overlapping a top portion of the protruding portion between the two adjacent concave portions.

In another aspect, there is provided a light-emitting display device, including: a substrate, a plurality of pixels on the substrate, each pixel including an opening area, a planarization layer including a light extraction pattern disposed in each opening area, the planarization layer including: a plurality of concave portions spaced apart from each other, and a protruding portion surrounding each of the plurality of concave portions, a first electrode over the light extraction pattern, a light-emitting layer over the first electrode, the light-emitting layer including: a top portion, and a curved portion inclined from the top portion, and a second electrode over the light-emitting layer, wherein each opening area includes a non-emission convex area overlapping the top portion of the light-emitting layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages may be discussed below in conjunction with embodiments of the disclosure. It is to be understood that both the foregoing general description and the following detailed description of the present disclosure may be examples and explanatory, and may be intended to provide further explanation of the disclosure as claimed.

BRIEF DESCRIPTION OF THE DRAWINGS

The accompanying drawings, that may be included to provide a further understanding of the disclosure and may be incorporated in and constitute a part of this disclosure, illustrate embodiments of the disclosure and together with the description serve to explain various principles of the disclosure.

Figure 1:
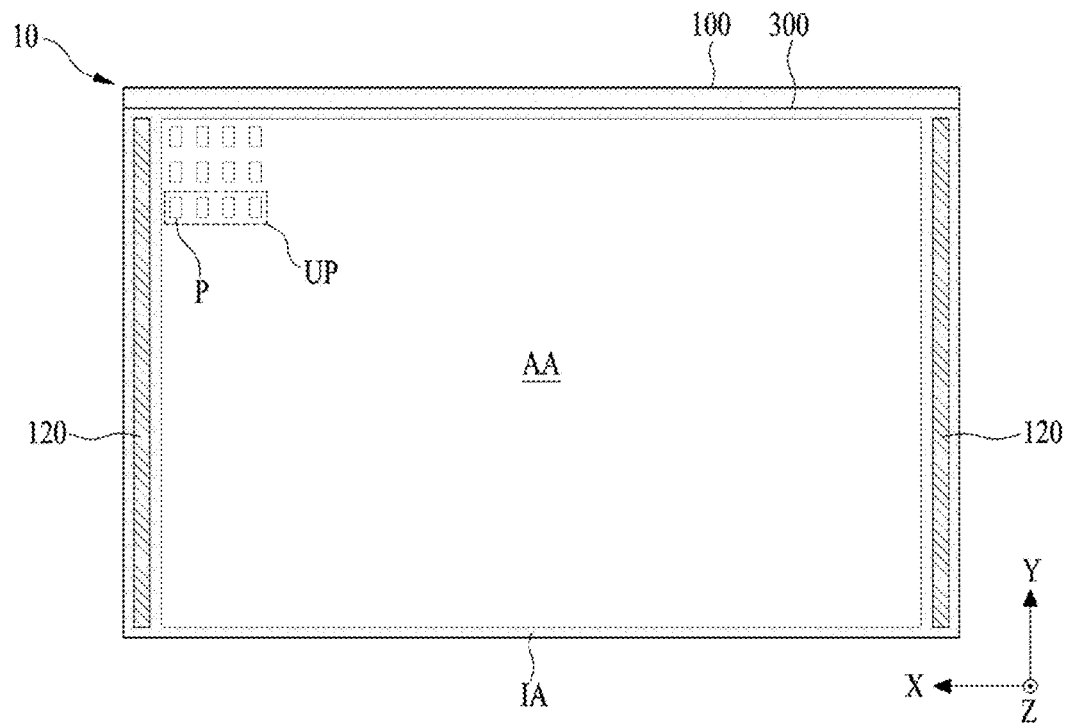
FIG. 1 is a diagram schematically illustrating a light-emitting display device according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations may be selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments may be provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure may be merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. When terms "include," "have," and "include" described in the present disclosure may be used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used. In describing a time relationship, when the temporal order is described as, for example, "after," "subsequent," "next," or "before," a case that is not continuous may be included, unless a more limiting term, such as "just," "immediate(ly)," or "direct(ly)," is used.

It will be understood that, although the terms "first," "second," etc. May be used herein to describe various elements, these elements should not be limited by these terms. These terms may be only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms may be merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings may be given merely for the convenience of description, and embodiments of the present disclosure may be not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning for example consistent with their meaning in the context of the relevant art and should not be interpreted in an idealized or overly formal sense unless expressly so defined herein. For example, the term "part" or "unit" may apply, for example, to a separate circuit or structure, an integrated circuit, a computational block of a circuit device, or any structure configured to perform a described function as should be understood to one of ordinary skill in the art.

Hereinafter, example embodiments of the present disclosure will be described in detail with reference to the accompanying drawings.

FIG. 1 is a diagram schematically illustrating a light-emitting display device according to an embodiment of the present disclosure.

With reference to the example of FIG. 1, a light-emitting display device according to an embodiment of the present disclosure may include a display panel 10 and a panel driving circuit part. The display panel 10 may include a substrate 100 and an opposite substrate 300 bonded to each other.

The substrate 100 may include a thin-film transistor, and the substrate 100 may be a first substrate, a lower substrate, a transparent glass substrate, or a transparent plastic substrate. The substrate 100 may include a display area AA and a non-display area IA.

The display area AA may be an area for displaying an image. The display area AA may be a pixel array area, an active area, a display portion, or a screen. For example, the display area AA may be disposed at a central area of the display panel 10. The display area AA may include a plurality of pixels P.

Each of the plurality of pixels P may be defined as a unit area in which light may be actually emitted. According to an embodiment, among the plurality of pixels P, three pixels, which may be disposed adjacently or disposed along a first direction X, may constitute a "unit pixel." For example, the unit pixel may include at least one red pixel, at least one green pixel, and at least one blue pixel, but is not limited thereto. According to another embodiment, among the plurality of pixels P, four pixels, which may be disposed adjacently or disposed along the first direction X, may constitute a unit pixel, e.g., a unit pixel UP in the example of FIG. 1. The unit pixel may include at least one red pixel, at least one green pixel, at least one blue pixel, and at least one white pixel, but is not limited thereto. For example, each of the at least one red pixel, at least one green pixel, at least one blue pixel, and at least one white pixel may each be a subpixel.

Each of the plurality of pixels P may include a pixel circuit, and a light-emitting device layer connected with the pixel circuit. The light-emitting device layer may include a light-emitting layer (e.g., a light-emitting device) interposed between a first electrode and a second electrode.

The non-display area IA may be an area in which an image may be not displayed. The non-display area IA may be a peripheral circuit area, a signal supply area, a non-active area, or a bezel area. The non-display area IA may surround the display area AA. The display panel 10 or substrate 100 may further may include a peripheral circuit portion 120 disposed at the non-display area IA.

The peripheral circuit portion 120 (e.g., a panel-embedded circuit portion) may include a gate driving circuit connected to the plurality of pixels P. The gate driving circuit may be integrated at one side or both sides of the non-display area IA of the substrate 100 according to a manufacturing process of a thin-film transistor and may be connected to the plurality of pixels P. For example, the gate driving circuit may include a shift register as known in the art.

The opposite substrate 300 may encapsulate (or seal) the display area AA disposed at the substrate 100. For example, the opposite substrate 300 may be bonded to the substrate 100 by using an adhesive member (e.g., a transparent adhesive). The opposite substrate 300 may be an upper substrate, a second substrate, or an encapsulation substrate.

Additionally, the display panel 10 according to an embodiment of the present disclosure may further may include an optical film that may be disposed to a light extraction surface from which light emitted from the pixel P may be emitted among the first substrate 100 and the opposite substrate 300. For example, the optical film may further may include a polarization film that may be attached to a rear surface (e.g., the light extraction surface) of the substrate 100.

Figure 2:
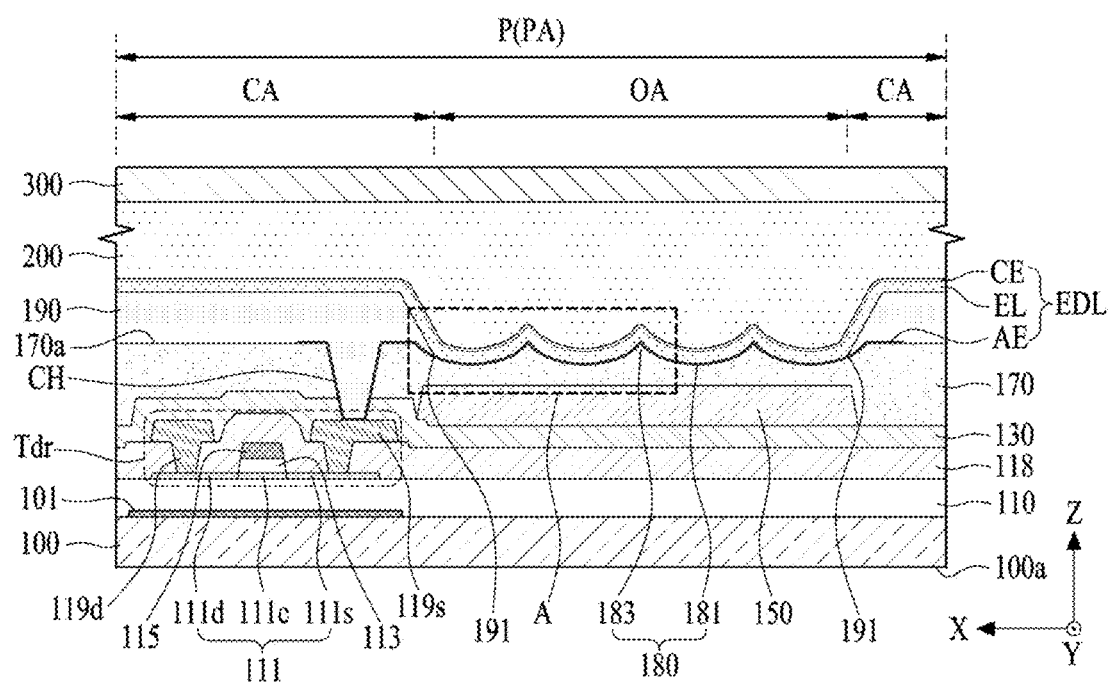
FIG. 2 is a sectional view illustrating one pixel illustrated in FIG. 1.

FIG. 2 is a sectional view illustrating one pixel illustrated in FIG. 1.

With reference to the example of FIG. 2, a pixel P according to an embodiment of the present disclosure may include a pixel area PA including a circuit area CA. The pixel area PA may include an opening area OA. The circuit area CA may be spatially separated from the opening area OA within the pixel P. The opening area OA may be defined as the remaining portions, except for the circuit area CA in the pixel area PA. For example, the opening area OA may be an opening or a light-generating portion. The circuit area CA may be a non-opening area or a non-opening portion.

The light-emitting display device according to an embodiment of the present disclosure may include a buffer layer 110, a pixel circuit portion, a protection layer 130, a planarization layer 170, and a light-emitting device layer EDL over the substrate 100. The buffer layer 110 may be disposed at an entire area of the first surface (e.g., a front surface) 100a of the substrate 100. The buffer layer 110 may reduce or prevent materials contained in the substrate 100 from spreading to a transistor layer for a high-temperature operation of a process for manufacturing the thin-film transistor, or may reduce or prevent external water or moisture from being permeated into the light-emitting device layer EDL. Selectively, according to some embodiments of the present disclosure, the buffer layer 110 may be omitted.

The pixel circuit portion may include the driving thin-film transistor Tdr disposed at the circuit area CA. The driving thin-film transistor Tdr may include an active layer 111, a gate insulating film 113, a gate electrode 115, an insulating interlayer 118, a drain electrode 119$d$, and a source electrode 119$s$.

The active layer 111 included in the driving thin-film transistor Tdr may be configured with a semiconductor material based on any one of amorphous silicon, polycrystalline silicon, oxide, and organic materials. The gate insulating film 113 may be provided over a channel region 111$c$ of the active layer 111. As an example, the gate insulating film 113 may be provided as an island shape only over the channel region 111$c$ of the active layer 111, or may be provided over the entire surface of the buffer layer 110 or substrate 100 including the active layer 111.

The insulating interlayer 118 may be provided over the gate electrode 115, and a drain region 111$d$ and a source region 111$s$ of the active layer 111. The insulating interlayer 118 may be formed at the entire areas of the opening area OA and the circuit area CA. For example, the insulating interlayer 118 may be an inorganic material or an organic material.

The pixel circuit portion may further include at least one capacitor and at least one switching thin-film transistor disposed at the circuit area CA together with the driving thin-film transistor Tdr. The capacitor may be provided in an overlap area of the gate electrode 115 and the source electrode 119$s$ of the driving thin-film transistor Tdr, with the insulating interlayer (e.g., an insulating layer) 118 interposed therebetween.

The at least one switching thin-film transistor may be provided at the circuit area CA to have substantially the same structure as the driving thin-film transistor Tdr. Thus, repetitive descriptions may be omitted. The at least one switching thin-film transistor may be switched (or driven) to initialize a voltage of the capacitor or store a data voltage in the capacitor.

Additionally, the pixel circuit portion may further include a light-blocking layer 101 provided below (or under) the active layer 111 of at least one of the thin-film transistors provided at the circuit area CA. The light blocking layer 101 may be provided between the substrate 100 and the active layer 111, and may serve to reduce, minimize, or prevent change in a threshold voltage of the transistor due to external light by blocking light, which may be incident at the active layer 111 via the substrate 100. The light blocking layer 101 may be covered (or surrounded) by the buffer layer 110. Selectively, the light blocking layer 101 may be electrically connected to the source electrode of the transistor, or may be electrically connected to a separate bias power source, and may serve as a lower gate electrode of the corresponding thin-film transistor. In this case, the light blocking layer 101 may reduce, minimize, or prevent change in characteristics due to light or change in a threshold voltage of the transistor due to a bias voltage.

The protection layer 130 may be provided over the substrate 100 to cover (or overlay) the transistor layer including the thin-film transistors. That is, the protection layer 130 may cover (or overlay) the drain electrode 119d and the source electrode 119s of the driving thin-film transistor Tdr and the insulating interlayer 118. For example, the protection layer 130 may be formed of an inorganic insulating material, and may be referred to as a "passivation layer." Selectively, the protection layer 130 may be omitted.

The planarization layer 170 may be provided over the substrate 100 to cover (or overlay) the protection layer 130. When the protection layer 130 is omitted, the planarization layer 170 may be provided over the substrate 100 to cover (or overlay) the pixel circuit portion. The planarization layer 170 may be provided over the entire areas of the circuit area CA and the emission area EA. Also, the planarization layer 170 may be provided over the entire display area AA and the remaining portions of the non-display area IA, except for a pad area.

The planarization layer 170 according to an embodiment of the present disclosure may be configured to have a relatively large thickness, so that the planarization layer 170 may provide a planarized surface over the display area AA. For example, the planarization layer 170 may be formed of an organic material such as photo acrylic, benzocyclobutene, polyimide, fluorine resin, or the like, but is not limited thereto.

The planarization layer 170 may include the light extraction pattern 180 disposed at the pixel area PA. The light extraction pattern 180 may be provided over an upper surface 170a of the planarization layer 170 to be overlapping the opening area OA of the pixel area PA. The light extraction pattern 180 may be provided over the planarization layer 170 of the opening area OA to have a curved (or uneven) shape. Thus, a progress path of light emitted from the light-emitting device layer EDL may be changed to increase light extraction efficiency of the pixel P. The light extraction pattern 180 may be formed or implemented with a lens shape having a convex surface and a concave surface. For example, the light extraction pattern 180 may be referred to as a "non-planar portion," an "optical path control portion," a "microlens portion," a "microlens array," or a "light scattering pattern."

The light extraction pattern 180, according to an embodiment, may include a plurality of concave portions 181 and a protruding portion 183 between the plurality of concave portions 181. Each of the plurality of concave portions (or depressions) 181 may be concavely formed or implemented from the upper surface (or the flat surface) 170a of the planarization layer 170 by a patterning process of the planarization layer 170. For example, the lower surface 181b of the plurality of concave portions 181 may be positioned between the upper surface 170a of the planarization layer 170 and the substrate 100.

Each of the plurality of concave portions 181 may be configured to have the same depth with respect to an upper surface 170a of the planarization layer 170, but is not limited thereto. For example, some of the plurality of concave portions 181 may have different depths within an error or tolerance range for a patterning process of the light extraction pattern 180.

The protruding portion 183 may be surround each of the plurality of concave portions 181. Thus, the planarization layer 170, overlapping the opening area OA, may include the plurality of concave portions 181, which may be surrounded by the protruding portion 183. The protruding portion 183 may be formed or implemented to have a shape that may increase or maximize external extraction efficiency of light that may be emitted from the light-emitting device layer EDL. Therefore, the protruding portion 183 may change a propagation path of light emitted from the light-emitting device layer EDL toward the light extraction surface (e.g., the light output surface) to enhance the external extraction efficiency of light emitted from the light-emitting device layer EDL. For example, the protruding portion 183 may reduce, minimize, or prevent a decrease in light extraction efficiency due to light trapped in the light-emitting device layer EDL by repeating total reflection in the light-emitting device layer EDL, without traveling to the light extraction surface.

According to an embodiment of the present disclosure, a formation area (or an arrangement area) of the light extraction pattern 180 in one pixel P may be grater than the opening area OA. For example, when the formation area (or the arrangement area) of the light extraction pattern 180 is smaller than the opening area OA, light generated at the edge of the opening area OA may travel to other adjacent pixels, which may cause color mixing between adjacent pixels P.

The light extraction pattern 180, including the plurality of concave portions 181 and the protruding portion 183, may be formed through a patterning process of the planarization layer 170 using a mask pattern after the mask pattern is formed over the planarization layer 170 of the opening area OA, e.g., through a photolithography process using a photoresist. For example, a positive photoresist may be used as the photoresist to improve productivity.

The light-emitting device layer EDL may be disposed at the light extraction pattern 180 of the opening area OA, and may emit the light toward the substrate 100 according to a bottom-emission type, but is limited thereto. The light-emitting device layer EDL according to an embodiment may include a first electrode AE, a light-emitting layer EL, and a second electrode CE.

The first electrode AE may be provided over the planarization layer 170 of the pixel area PA, and may be electrically connected to the source electrode 119s of the driving thin-film transistor Tdr. One end of the first electrode AE, which may be close to the circuit area CA, may extend onto the source electrode 119s of the driving thin-film transistor Tdr, and may be electrically connected to the source electrode 119s of the driving thin-film transistor via an electrode contact hole CH at the planarization layer 170 and the protection layer 130.

The first electrode AE may directly contact the light extraction pattern 180. The first electrode AE may have a shape corresponding to (or conforming to) the light extraction pattern 180. As the first electrode AE may be provided (or deposited) over the planarization layer 170, and may be configured to have a relatively small thickness, the first electrode El may have a surface morphology (or second surface shape) which conforms to (or corresponds to) a surface morphology (or first surface shape) of the light extraction pattern 180, including the plurality of concave portions 181 and the protruding portion 183. For example, the first electrode AE may be formed in a conformal shape based on the surface shape (morphology) of the light extraction pattern 180 by a deposition process of a transparent conductive material, whereby the first electrode AE may have a cross-sectional structure whose shape may be the same as the light extraction pattern 180.

The first electrode AE, according to an embodiment, may include a transparent conductive material, such as transparent conductive oxide (TCO), such that light emitted from the light-emitting layer EL may be transmitted to the substrate 100. For example, the first electrode AE may be formed of indium tin oxide (ITO) or indium zinc oxide (IZO). For example, the first electrode AE may be referred to as an "anode," an "anode electrode," a "pixel electrode," a "transparent electrode," a "transparent pattern electrode," or the like.

The light-emitting layer EL may be provided over the first electrode AE, and may directly contact the first electrode AE. As the light-emitting layer AE may be provided (or deposited) over the first electrode AE, and may be configured to have a relatively large thickness in comparison to the first electrode AE. The light-emitting layer EL may have a surface morphology (or third surface shape) that may be different from (or may not correspond to) the surface morphology in each of the plurality of concave portions 181 and the protruding portion 183 or the surface morphology of the first electrode AE. For example, the light-emitting layer EDL may be formed in a non-conformal shape that does not conform to the surface shape (or morphology) of the first electrode AE by a deposition process, whereby the light-emitting layer EL may have a cross-sectional structure whose shape may be different from that of the first electrode AE.

Figure 6:
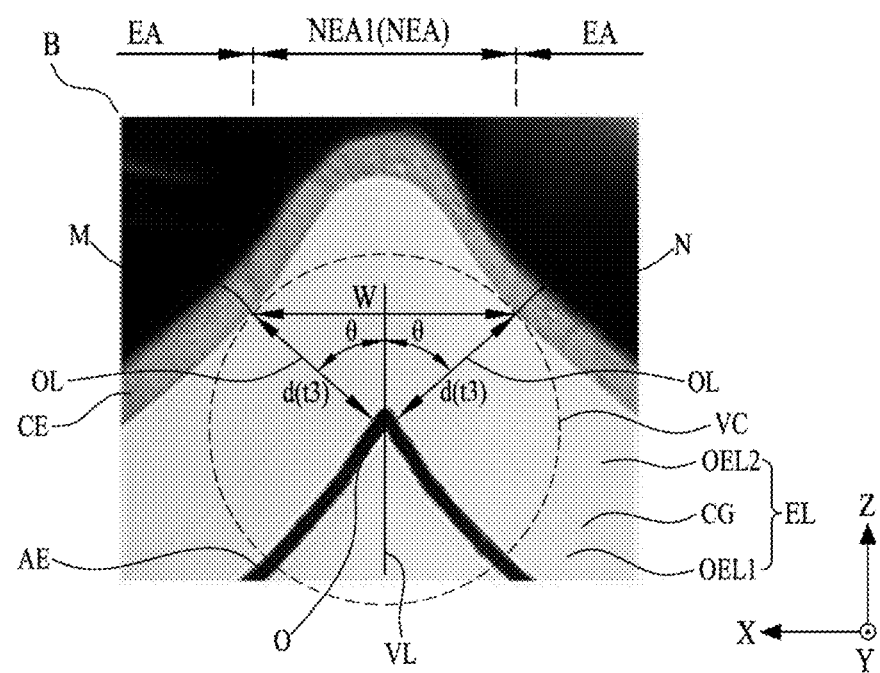
FIG. 6 is a photomicrograph illustrating an example of the part 'B' illustrated in FIG. 3.

The light-emitting layer EL, according to an embodiment of the present disclosure, may include two or more light-emitting layers for emitting white light. As an embodiment, the light-emitting layer EL may include a first organic light-emitting layer and a second organic light-emitting layer to emit white light by a mixture of first light and second light. For example, the first organic light-emitting layer may include any one of: a blue organic light-emitting layer, a green organic light-emitting layer, a red organic light-emitting layer, a yellow organic light-emitting layer, and a yellow-green light organic emitting layer to emit the first light. For example, the second organic light-emitting layer may include a light-emitting layer capable of emitting the second light to obtain white light in the light-emitting layer EL by a mixture with the first light of a blue organic light-emitting layer, a green organic light-emitting layer, a red organic light-emitting layer, a yellow organic light-emitting layer, or a yellow-green organic light-emitting layer. As another embodiment, the light-emitting layer EL may include any one of: a blue organic light-emitting layer, a green organic light-emitting layer, and a red organic light-emitting layer. Additionally, as illustrated in the example of FIG. 6, the light-emitting layer EL may further include a charge generation layer CG interposed between the first organic emitting layer OEL1 and the second organic emitting layer OEL2. The first organic emitting layer OEL1, the second organic emitting layer OEL2, and the charge generation layer CG may be sequentially deposited (or formed) over the first electrode AE in a non-conformal shape which does not conform to the surface shape (or morphology) of the first electrode AE.

With reference again to FIG. 2, the light-emitting layer EL, according to an embodiment of the present disclosure, may include at least one organic light-emitting layer to emit blue light. The second electrode CE may be provided at the light-emitting device layer EDL, and may directly contact the light-emitting layer EL. The second electrode CE may be formed (or deposited) at the light-emitting layer EL to have a relatively small thickness compared to the light-emitting layer EL. The second electrode CE may be formed (or deposited) at the light-emitting layer EL to have a relatively small thickness. Thus, the second electrode CE may have a surface morphology corresponding to the surface morphology of the light-emitting layer EL. For example, the second electrode CE may be formed in a conformal shape corresponding to the surface shape (or morphology) of the light-emitting layer EL by a deposition process, whereby the second electrode CE may have the same cross-sectional structure as the light-emitting layer EL.

The second electrode CE, according to an embodiment, may include a metal material having a high reflectance to reflect the incident light emitted from the light-emitting layer EL toward the substrate 100. The second electrode CE may include an opaque conductive material having high reflectance. For example, the second electrode CE may include a single-layered structure or multi-layered structure of one or more of: aluminum (Al), argentums (Ag), molybdenum (Mo), aurum (Au), magnesium (Mg), calcium (Ca), and barium (Ba), or may be an alloy of two or more materials among: aluminum (Al), argentums (Ag), molybdenum (Mo), aurum (Au), magnesium (Mg), calcium (Ca), or barium (Ba). For example, the second electrode CE may be referred to as a "cathode," a "cathode electrode," a "common electrode," a "reflective electrode," or the like.

The light-emitting display device according to an embodiment of the present disclosure may further include a wavelength conversion layer 150. The wavelength conversion layer 150 may be disposed between the substrate 100 and the planarization layer 170 to overlap at least one opening area OA. The wavelength conversion layer 150, according to an embodiment, may be disposed between the protection layer 130 and the planarization layer 170 to overlap the opening area OA. The wavelength conversion layer 150, according to another embodiment, may be disposed between the substrate 100 and the insulating interlayer 118, or between the insulating interlayer 118 and the protection layer 130, to overlap the opening area OA.

The wavelength conversion layer 150 may have a relatively large size compared to the opening area OA. For example, the wavelength conversion layer 150 may be larger than the opening area OA, and may be smaller than the light extraction pattern 180 of the planarization layer 170, but is not limited thereto. For example, the wavelength conversion layer 150 may be larger than the light extraction pattern 180 of the planarization layer 170. For example, the wavelength conversion layer 150 may have a size corresponding to the whole pixel area PA of each pixel P.

The wavelength conversion layer 150, according to an embodiment, may include a color filter that may transmit only the wavelength corresponding to a color in the pixel of the light emitted (or extracted) from the light-emitting device layer EDL toward the substrate 100. For example, the wavelength conversion layer 150 may transmit only the red wavelength, the green wavelength, or the blue wavelength. When one unit pixel includes adjacent first to fourth pixels P, the wavelength conversion layer at the first pixel may include a red color filter, the wavelength conversion layer at the second pixel may include a green color filter, and the wavelength conversion layer at the third pixel may include a blue color filter. The fourth pixel may not include a wavelength conversion layer, or may include a transparent material to compensate a step difference between adjacent pixels, thereby emitting white light.

The wavelength conversion layer 150, according to another embodiment, may include a quantum dot to emit light of a color set in the pixel P corresponding to the blue light emitted from the light-emitting device layer EDL toward the substrate 100. Optionally, the wavelength conversion layer 150, according to another embodiment, may be implemented with a sheet (or a film) including a quantum dot layer overlapping the opening area OA of the plurality of pixels P, and may be attached to the light extraction surface.

The light-emitting display device according to an embodiment of the present disclosure may further include a bank layer 190 and an encapsulation layer 200. The bank layer 190 (or bank pattern) may define the opening area OA within the pixel area PA, and may be disposed at the planarization layer 170 and at an edge of the first electrode AE. The bank layer 190 may overlap the edge of the wavelength conversion layer 150. The bank layer 190 may be formed of an organic material, such as a benzocyclobutene (BCB)-based resin, an acrylic-based resin, a polyimide resin, or the like. For example, the bank layer 190 may be formed of a photosensitizer including a black pigment. In this case, the bank layer 190 may also function as a light-shielding member between neighboring pixels.

The bank layer 190, according to an embodiment, may be disposed over the upper surface 170a of the planarization layer 170 to cover (or overlay) the edge of the first electrode AE extending onto the circuit area CA of the pixel area PA, and may be disposed to cover (or overlay) the edge of the light extraction pattern 180. The opening area OA, defined by the bank layer 190, may be smaller in size than the light extraction pattern 180 of the planarization layer 170 in a two-dimensional structure (or cross-sectional view). For example, the upper surface 170a of the planarization layer 170 in direct contact with the bank layer 190 may be referred to as a "flat surface," a "flat portion," or the like. The flat surface 170a of the planarization layer 170 may surround the light extraction pattern 180 disposed in each pixel P.

The light-emitting device layer EDL may be provided over the first electrode AE, the bank layer 190, and a step difference portion between the first electrode AE and the bank layer 190. When the light-emitting device layer EDL is provided at a small thickness at the step difference portion between the first electrode AE and the bank layer 190, there may be an electrical contact (or short) between the second electrode CE and the first electrode E1 due to a thickness reduction of the light-emitting device layer EDL. To avoid or prevent this problem, one end 191 of the bank layer 190 may be disposed to be covered (or overlaid) by the edge of the light extraction pattern 180 to reduce a step difference between the first electrode E1 and the bank layer 190, thereby preventing the electric contact (or short) between the anode electrode AE and the cathode electrode CE. For example, one end 191 of the bank layer 190 may be disposed between the upper surface 170a of the planarization layer 170 and the bottom surface 181b of the outermost concave portion 181 of the light extraction pattern 180.

Each of the light-emitting layer EL and the second electrode CE of the light-emitting device layer EDL may be further provided over the bank layer 190. That is, the light-emitting layer EL may be disposed to cover (or overlay) the first electrode AE and the bank layer 190, and the second electrode CE may be formed to cover (or overlay) the light-emitting layer EL.

The encapsulation layer 200 may be formed over substrate 100 to cover (or overlay) the second electrode CE. For example, the encapsulation layer 200 may be disposed between the substrate 100 and the opposite substrate 300, and may surround the display area. The encapsulation layer 200 may serve to protect the thin-film transistor and the light-emitting device layer EDL from external impact, and may reduce or prevent oxygen or/and water and particles from permeating into the light-emitting device layer EDL.

The encapsulation layer 200, according to an embodiment, may include a plurality of inorganic encapsulation layers. The encapsulation layer 200 may further include at least one organic encapsulation layer interposed between the plurality of inorganic encapsulation layers.

The encapsulation layer 200, according to another embodiment, may further include a filler completely surrounding the display area. In this case, the opposite substrate 300 may be bonded to the substrate 100 using the filler.

In the light-emitting display device according to the embodiment of the present disclosure, a path of light emitted from the light-emitting device layer EDL may be changed by light extraction pattern 180, including the plurality of concave portions 181 and the protruding portion 183 provided in the opening area OA of the pixel P, to improve the light extraction efficiency. Thus, it may be possible to enhance luminance and to reduce power consumption.

Figure 3:
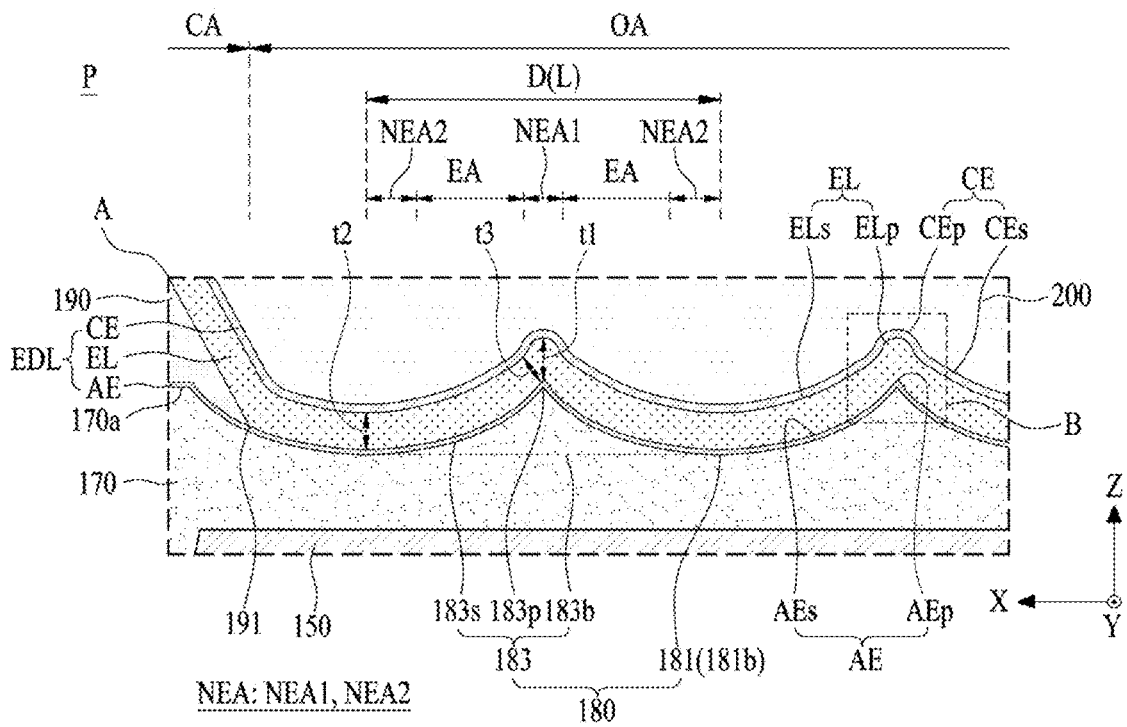
FIG. 3 is an enlarged view of part 'A' illustrated in FIG. 2.

FIG. 3 is an enlarged view of 'A' shown in FIG. 2.

FIG. 3 illustrates a cross sectional structure of a light extraction pattern and a light-emitting device layer. With reference to the examples of FIGS. 2 and 3, the light extraction pattern 180, according to an embodiment of the present disclosure, may include a plurality of concave portions 181 and a protruding portion 183 surrounding each of the plurality of concave portions 181.

The plurality of concave portions 181 may be concavely formed from the upper surface 170a of the planarization layer 170 to have the same or different pitch (or interval) D, e.g., length L. According to an embodiment of the present disclosure, the pitch (or interval) D, between the concave portions 181 disposed in each of the plurality of pixels P configuring one unit pixel, may be the same or different. Herein, the pitch between the concave portions 181 may be an interval (or distance) between the center portions CP of the two adjacent concave portions 181. As an example, the pitch D between the concave portions 181, disposed in each of the red, green, and blue pixels configuring one unit pixel, may be the same or different. For example, the pitch D, between the concave portions 181 disposed in the green pixel, may be different from the pitch between the concave portions 181 disposed in the blue pixel. As another example, the pitch D, between the concave portions 181 disposed in each of the red, green, blue and white pixels configuring one unit pixel, may be the same or different. For example, the pitch D, between the concave portions 181 disposed in each of the white pixel and/or the green pixel, may be different from the pitch D between the concave portions 181 disposed in the red pixel and/or the blue pixel.

The pitch (or interval) D between the two adjacent concave portions 181 according to an embodiment of the present disclosure may have a range of 4 µm to 5 µm (4 µm≤D≤5 µm), but is not limited thereto. For example, the pitch (or interval) D between the two adjacent concave portions 181 may be 4 µm or less than 4 µm, or may be 5 µm or more than 5 µm, based on the size of the pixel P or the luminance of the pixel P.

The protruding portion 183 may be implemented to individually surround each of the plurality of concave portions 181. The protruding portion 183 may be disposed between the adjacent two concave portions 181, and the protruding portions 183 may be connected to each other between the plurality of concave portions 181. For example, the protruding portion 183, surrounding one concave portion 181, may have a hexagonal shape (or honeycomb shape) in plan view.

The protruding portion 183, according to an embodiment of the present disclosure, may include a vertex portion having a sharp tip structure (or a pointed tip structure). The protruding portion 183 according to an embodiment of the present disclosure may include a bottom portion (or bottom surface) 183*b*, a first top portion 183*p* over the bottom portion 183*b*, and a first inclined portion 183*s* between the bottom portion 183*b* and the first top portion 183*p*.

The bottom portion 183*b* of the protruding portion 183 may be the bottom surface 181*b* of the concave portion 181. For example, the bottom portion 183*b* of the protruding portion 183, and the bottom surface 181*b* of the concave portion 181, may be positioned at the same plane.

The first top portion 183*p* may be positioned at the same plane as the upper surface 170*a* of the planarization layer 170, or may be positioned between the upper surface 170*a* of the planarization layer 170 and the substrate 100. For example, the distance between the first top portion 183*p* and the substrate 100 may be equal to or smaller than the distance between the top surface 170*a* of the planarization layer 170 and the substrate 100.

To increase the light extraction efficiency of the pixel P, the first top portion 183*p* may have a sharp tip structure. Accordingly, the end portion of the first top portion 183*p* may be referred to as a "peak portion," a "pointed portion," a "sharp portion," or a "vertex." Additionally, the end portion of the first top portion 183*p* may be rounded to have a curvature of several tens to hundreds of Angstroms (Å), but a rounding portion having a curvature of several to hundreds of Angstroms (Å) may be interpreted as a substantially sharp tip structure. For example, when the cross-sectional structural view of the first top portion 183*p* is enlarged with an ultra-high magnification microscope, the end portion of the first top portion 183*p* may be interpreted as having a constant curvature.

The first inclined portion 183*s* may have a curved shape between the bottom portion 183*b* and the first top portion 183*p*. The first inclined portion 183*s* may form or implement the concave portion 181. For example, the first inclined portion 183*s* may be referred to as an "inclined surface," a "slope," or the like.

The first inclined portion 183*s* may be formed in a concave curve (or curved) shape between the first top portion 183*p* and the bottom surface 181*b* of the concave portion 181. The first inclined portion 183*s* may have a tangential slope, which may gradually decrease from the first top portion 183*p* to the bottom surface 181*b* of the concave portion 181. Herein, the tangential slope may be defined as an angle between the extension line extending from the bottom surface 181*b* of the concave portion 181 or the bottom portion 183*b* of the protruding portion 183 and the first inclined portion 183*s*.

The first inclined portion 183*s* may have a symmetric structure with respect to the first top portion 183*p* between the two adjacent concave portions 181. For example, the first inclined portion 183*s* may include a 1-1 inclined portion and a 1-2 inclined portion having a symmetrical structure with respect to the first top portion 183*p*. The 1-1 inclined portion may form a portion of the first concave portion of the two adjacent first and second concave portions 181, and the 1-2 inclined portion may form a portion of the second concave portion of the two adjacent first and second concave portions 181.

To increase or maximize the light extraction efficiency of the pixel P, the first inclined portion 183*s* may have the largest tangential slope, that is, the maximum tangential slope, at the top portion of the protruding portion 183 adjacent to the first top portion 183*p*. In other words, the tangential slope of the protruding portion may be larger at the top portion 183*p* than at other areas of the protruding portion 183. The protruding portion 183 may have a triangular cross-sectional structure, including a vertex corresponding to the first top portion 183*p*, a bottom side corresponding to the bottom portion 183*b*, and an oblique side corresponding to the first inclined portion 183*s*.

The light-emitting device layer EDL, according to an embodiment of the present disclosure, may include a first electrode AE over the light extraction pattern 180, a light-emitting layer EL over the first electrode AE, and a second electrode CE over the light-emitting layer EL. The first electrode AE may be in direct contact with the surface (e.g., a top surface) of the protruding portion 183, and may have a relatively small thickness. Accordingly, the first electrode AE may have a surface shape that conforms to the surface shape of the protruding portion 183. For example, the first electrode AE may be formed to cover (or overlay) the protruding portion 183 in a conformal manner or shape (e.g., may have a corresponding shape) by a deposition process of a transparent conductive material.

According to an embodiment of the present disclosure, the first electrode AE may include a second top portion AEp and a second inclined portion AEs. The second top portion AEp may be formed over the first top portion 183*p* of the protruding portion 183. The second top portion AEp, according to an embodiment of the present disclosure, may have a sharp tip structure corresponding to the tip structure of the first top portion 183*p*. Additionally, the end portion of the second top portion AEp may be formed in a convex curved shape over the end portion of the first top portion 183*p*, based on the thickness. For example, as illustrated in the example of FIG. 3, the end portion of the second top portion AEp may be formed in a convex curved shape on the end portion of the first top portion 183*p*, but is not limited thereto.

The second inclined portion AEs may be formed over the first inclined portion 183*s* of the protruding portion 183. The second inclined portion AEs may be formed to cover (or overlay) the first inclined portion 183*s* of the protruding portion 183 in a conformal manner. Accordingly, the second inclined portion AEs may be formed in a concave curve (or curved) shape between the second top portion AEp and the bottom surface 181*b* of the concave portion 181. For example, the second inclined portion AEs may have a tangential slope, which may gradually decrease from the second top portion AEp toward the bottom surface 181*b* of the concave portion 181. Herein, the tangential slope of the second inclined portion AEs may be different from the tangential slope of the first inclined portion 183s of the protruding portion 183.

The second inclined portion 181 may have a symmetrical structure with respect to the second top portion AEp between the two adjacent concave portions 181. For example, the second inclined portion AEs may include a 2-1 inclined portion and a 2-2 inclined portion having a symmetrical structure with respect to the second top portion AEp. The 2-1 inclined portion may be formed over the 1-1 inclined portion of the protruding portion 183, and the 2-2 inclined portion may be formed over the 1-2 inclined portion of the protruding portion 183.

The light-emitting layer EL may be in direct contact with the surface (e.g., a top surface) of the first electrode AE, and may have a thickness that may be relatively thicker than the first electrode AE. Accordingly, the light-emitting layer EL may have a non-conformal surface shape, which may not conform to the surface shape of the protruding portion 183 or the first electrode AE. For example, the light-emitting layer EL may be formed to cover (or overlay) the first electrode AE in a non-conformal manner by a deposition process of an organic material.

The light-emitting layer EL, according to an embodiment of the present disclosure, may have a thickness that becomes gradually thicker toward the bottom surface 181b of the concave portion 181. The light-emitting layer EL may be formed to have a thickness that becomes gradually thicker from the first top portion 183p of the protruding portion 183 to the bottom surface 181b of the concave portion 181. For example, the light-emitting layer EL may have a first thickness t1 over the second top portion AEp of the first electrode AE, and a second thickness t2 over the bottom surface 181b of the concave portion 181. The light-emitting layer EL may be formed over the second inclined portion AEs of the first electrode AE so that the light-emitting layer EL may have a thickness that becomes gradually thicker from the second top portion AEp of the first electrode AE toward the bottom surface 181b of the concave portion 181. Herein, each of the first and second thicknesses t1 and t2 may correspond to the shortest distance between the first electrode AE and the second electrode CE. According to an embodiment of the present disclosure, the first thickness t1 may be thicker or thinner than the second thickness t2, according to the slope of the inclined portion formed between the top portion 183p and the bottom surface 181b.

The light-emitting layer EL according to an embodiment of the present disclosure may include a third top portion ELp and a third inclined portion ELs. The third top portion ELp may be formed over the second top portion AEp of the first electrode AE. The third top portion ELp, according to an embodiment of the present disclosure, may be convexly formed to have a non-conformal shape with respect to the first top portion 183p having a sharp tip structure of the protruding portion 183. The third top portion ELp may convexly protrude on the second top portion AEp of the first electrode AE so that the third top portion ELp may cover (or overlay) the second top portion AEp of the first electrode AE and the first top portion 183p of the protruding portion 183.

The third top portion ELp may be formed or implemented to have a curvature for reducing or preventing incident light from being totally reflected inside the light-emitting layer EL by the emission of the light-emitting layer EL. The third top portion ELp, according to the third embodiment of the present disclosure, may include a convex curved dome or bell structure. The third top portion ELp may reflect the incident light, which may be totally reflected inside the light-emitting layer EL by the emission of the light-emitting layer EL, toward the substrate 100, and may increase the external extraction efficiency of the light generated by the light-emitting layer EL. For example, the third top portion ELp may serve as a concave lens that reflects the incident light, which may be totally reflected inside the light-emitting layer EL interposed between the first electrode AE and the second electrode CE, toward the substrate 100. For example, the third top portion ELp of the light-emitting layer EL may be represented by a protruding light-emitting layer, a convex light-emitting layer, a dome portion, a protruding portion, a convex protruding portion, or a concave lens portion.

The third inclined portion ELs may be formed over the second inclined portion AEs of the first electrode AE. The third inclined portion ELs may be formed to cover (or overlay) the second inclined portion AEs of the first electrode AE in a non-conformal manner. Accordingly, the third inclined portion ELs may be formed in a concave curve (or curved) shape between the third top portion ELp and the bottom surface 181b of the concave portion 181. For example, the third inclined portion ELs may have a tangential slope that gradually decreases from the third top portion ELp to the bottom surface 181b of the concave portion 181. Herein, the tangential slope of the third inclined portion ELs may be different from the tangential slope of the second inclined portion AEs of the first electrode AE. For example, the third inclined portion ELs of the light-emitting layer EL may be represented by a curved portion, a curved slope, a curved light-emitting layer, or an inclined light-emitting layer.

The third inclined portion ELs may have a symmetrical structure with respect to the third top portion ELp between the two adjacent concave portions 181. For example, the third inclined portion ELs may include a 3-1 inclined portion and a 3-2 inclined portion having a symmetrical structure with respect to the third top portion ELp. The 3-1 inclined portion may be formed over the 2-1 inclined portion of the first electrode AE, and the 3-2 inclined portion may be formed over the 2-2 inclined portion of the first electrode AE. For example, the third inclined portion ELs may be convexly protruding from an upper end of each of the 3-1 inclined portion and the 3-2 inclined portion disposed over the second top portion AEp of the first electrode AE.

The second electrode CE may be in direct contact with the surface (e.g., an upper surface) of the light-emitting layer EL, and may have a thickness relatively thinner than the light-emitting layer EL. Accordingly, the second electrode CE may have a surface shape according to the surface shape of the light-emitting layer EL. For example, the second electrode CE may be formed to cover (or overlay) the light-emitting layer EL in a conformal manner by a deposition process of a reflective conductive material.

The second electrode CE, according to an embodiment of the present disclosure, may include a fourth top portion CEp and a fourth inclined portion CEs. The fourth top portion CEp may be formed over the third top portion ELp of the light-emitting layer EL. The fourth top portion CEp, according to an embodiment of the present disclosure, may be formed in a convex curved surface structure of the third top portion ELp. For example, the fourth top portion CEp may be formed in a conformal manner with respect to the third top portion ELp of the light-emitting layer EL.

The fourth inclined portion CEs may be formed over the first inclined portion 183s of the protruding portion 183. The fourth inclined portion CEs may be formed to cover (or overlay) the third inclined portion ELs of the light-emitting layer EL in a conformal manner. Accordingly, the fourth inclined portion CEs may be formed in a concave curve (or curved) shape between the fourth top portion CEp and the bottom surface 181b of the concave portion 181. For example, the fourth inclined portion CEs may have a tangential slope that gradually decreases from the fourth top portion CEp toward the bottom surface 181b of the concave portion 181. Herein, the tangential slope of the fourth inclined portion CEs may be the same as the tangential slope of the third inclined portion ELs of the light-emitting layer EL.

The fourth inclined portion CEs may have a symmetrical structure with respect to the fourth top portion CEp between the two adjacent concave portions 181. For example, the fourth inclined portion CEs may include a 4-1 inclined portion and a 4-2 inclined portion having a symmetrical structure with respect to the fourth top portion CEp. The 4-1 inclined portion may be formed over the 3-1 inclined portion of the light-emitting layer EL, and the 4-2 inclined portion may be formed over the 3-2 inclined portion of the light-emitting layer EL. For example, the fourth inclined portion CEs may be convexly protruding or convex from the upper end of each of the 4-1 and 4-2 inclined portions disposed over the third top portion ELp of the light-emitting layer EL to cover (or overlay) the third top portion ELp in a conformal manner.

The light-emitting device layer EDL disposed over the light extraction pattern 180, including the plurality of concave portions 181 and the protruding portions 183, may include a non-emission area NEA and an emission area EA, according to the thickness of the light-emitting layer EL. For example, the light-emitting device layer EDL may emit light by a current flowing through the light-emitting layer EL between the first electrode AE and the second electrode CE. The current density flowing through the light-emitting layer EL may be different, based on the thickness of the light-emitting layer EL interposed between the first electrode AE and the second electrode CE. The emission of the light-emitting layer EL may occur primarily in a portion having a high current density. Thus, in a case of the light-emitting layer EL disposed over the light extraction pattern 180, a relatively strong light emission may be generated over the first inclined portion 183s of the protruding portion 183 where the light-emitting layer EL has a relatively thin thickness by a relatively high current density, and a relatively weak light emission may be generated over each of the first top portion 183p of the protruding portion 183 where the light-emitting layer EL has a relatively thick thickness and the bottom surface 181b of the concave portion 181 where the light-emitting layer EL has a relatively thick thickness by a relatively low current density. Accordingly, a portion corresponding to the first inclined portion 183s of the protruding portion 183 may be defined as the emission area EA (e.g., an effective emission area), and a portion corresponding to each of the first top portion 183p of the protruding portion 183 and the bottom surface 181b of the concave portion 181 may be defined as the non-emission area NEA (e.g., a non-effective emission area).

An opening area OA of the pixel P, according to an embodiment of the present disclosure, may include the non-emission area NEA and the emission area EA due to the thickness difference of the light-emitting layer EL disposed over the light extraction pattern 180. The non-emission area NEA, according to an embodiment of the present disclosure, may include a non-emission convex area NEA1 that may overlap or correspond to a top portion of the protruding portion 183 of the light extraction pattern 180. For example, the light-emitting device layer EDL may include the non-emission convex area NEA1 that may overlap or correspond to a top portion of the protruding portion 183.

The non-emission convex area NEA1 may include the first top portion 183p of the protruding portion 183. The non-emission convex area NEA1 may overlap or correspond to the third top portion ELp of the light-emitting layer EL. The non-emission convex area NEA1 may include the third top portion ELp of the light-emitting layer EL, in which the light-emitting layer EL may be formed at the first thickness t1. For example, the non-emission convex area NEA1 may include a convex curved shape corresponding to the third top portion ELp of the light-emitting layer EL having a convex curved surface shape on the first top portion 183p of the protruding portion 183. The non-emission convex area NEA1 may be defined as an area where light emission may occur or may not occur in the light-emitting layer EL due to a relatively low current density. For example, the non-emission convex area NEA1 may be referred to as a "first non-emission area," a "convex non-emission area," or an "upper non-emission area."

The non-emission area NEA, according to an embodiment of the present disclosure, may include a non-light-emitting concave area NEA2, which may overlap or correspond to the bottom surface 181b of the concave portion 181 of the light extraction pattern 180. For example, the light-emitting device layer EDL may include the non-light-emitting concave area NEA2, which may overlap or correspond to the bottom surface 181b of the concave portion 181.

The non-light-emitting concave area NEA2 may include the bottom surface 181b of the concave portion 181. The non-light-emitting concave area NEA2 may overlap or correspond to the bottom portion of the light-emitting layer EL disposed over the bottom surface 181b of the concave portion 181. For example, the non-light-emitting concave area NEA2 may include the bottom portion of the light-emitting layer EL, in which the light-emitting layer EL may be formed at the second thickness t2. For example, the non-light-emitting concave area NEA2 may be defined as an area where light emission may occur or no emission may occur in the light-emitting layer EL due to a relatively low current density. For example, the non-light-emitting concave area NEA2 may be referred to as a "second non-emission area," a "non-light-emitting bottom area," a "bottom non-emission area," a "concave non-emission area," or a "lower non-emission area."

The emission area EA may include the first inclined portion 183s of the protruding portion 183. The emission area EA may overlap or correspond to the third inclined portion ELs of the light-emitting layer EL. For example, the emission area EA may include the third inclined portion ELs of the light-emitting layer EL formed to have a thickness smaller than between the first thickness t1 or the second thickness t2. For example, the emission area EA may be defined as an area where light emission may be stronger than that of the non-emission area NEA by a current density relatively higher than that of the non-emission area NEA.

The protruding portion 183 of the light extraction pattern 180, according to an embodiment of the present disclosure, may have a shape capable of implementing the non-emission area NEA and the emission area EA in the light-emitting layer EL. For example, the tangential slope of the first inclined portion 183s in the protruding portion 183 may be set or formed such that light emission may occur in the light-emitting layer EL over the first inclined portion 183s, or light emission may not occur in the light-emitting layer EL over the first top portion 183p and the bottom surface 181b of the concave portion 181. As a result, the light-emitting layer EL may have high light extraction efficiency, as it may strongly emit light over the first inclined portion 183s of the protruding portion 183 by a high current density due to a relatively thin thickness of the light emitting layer EL, and the light emitted from the first inclined portion 183s of the protruding portion 183 may be reflected toward the substrate 100 by the first top portion 183p of the protruding portion 183, thereby greatly increasing the external extraction efficiency of light generated in the light-emitting layer EL. The light-emitting layer EL may have the weak light emission over the first top portion 183p of the protruding portion 183 by the low current density due to the relatively thick first thickness t1 of the light emitting layer EL, and the bottom surface 181b of the concave portion 181 by the low current density due to the second thickness t2 of the light emitting layer EL, thereby reducing power consumption.

Figure 4:
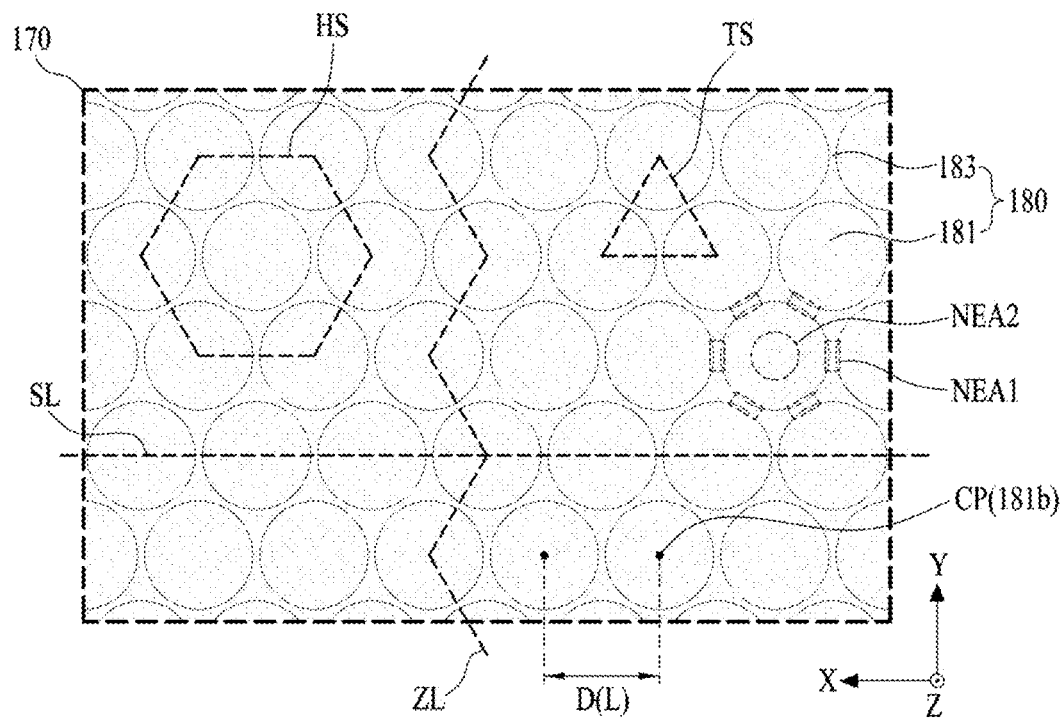
FIG. 4 is a plan view illustrating a light extraction pattern illustrated in FIG. 2.

FIG. 4 is a plan view illustrating the light extraction pattern illustrated in FIG. 2.

FIG. 4 explains a plan structure of the concave portion and the protruding portion. With reference to the examples of FIGS. 2 to 4, the plurality of concave portions 181 according to an embodiment of the present disclosure may be arranged in parallel to have a predetermined interval between each other along a first direction X, and may be alternately arranged along a second direction Y crossing the first direction X. As a result, the light extraction pattern 180 may include a larger number of concave portions 181 per unit area, thereby increasing the external extraction efficiency of the light emitted from the light-emitting device layer EDL.

According to an embodiment of the present disclosure, the central portion of each of the plurality of concave portions 181 disposed along the first direction X may be positioned or aligned in a straight line SL parallel to the first direction X. The central portion of each of the plurality of concave portions 181 disposed along the second direction Y may be positioned or aligned in a zigzag line ZL having a zigzag shape along the second direction Y. According to another embodiment, the plurality of concave portions 181 may be arranged in a lattice form, and each of the plurality of concave portions 181 disposed in the even-numbered horizontal line parallel to the first direction X may be disposed between the plurality of concave portions 181 disposed in the odd-numbered horizontal line along the second direction Y.

According to an embodiment, the central portion of each of three adjacent concave portions 181 may form a triangular shape (TS). In addition, the central portion of each of six concave portions 181 disposed around one concave portion 181 or surrounding one concave portion 181 may have a six (6)-angled shape (HS), e.g., a hexagon or hexagonal shape. For example, each of the plurality of concave portions 181 may be arranged or arranged in a honeycomb structure or a circle structure.

The protruding portion 183 may be implemented to individually surround each of the plurality of concave portions 181. Accordingly, the planarization layer 170 overlapping the opening area OA may include the plurality of concave portions 181 surrounded by the protruding portions 183. The protruding portion 183 surrounding one concave portion 181 may have a hexagonal shape (or honeycomb shape).

A portion of the protruding portion 183 disposed between the two adjacent concave portions 181 may be defined as the non-emission convex area NEA1. For example, the non-emission convex area NEA1 may correspond to each side of the hexagonal-shaped protruding portion 183 surrounding one concave portion 181, except for a corner portion of the hexagonal shape. For example, the non-emission convex area NEA1 may correspond to the top portion (or first peak portion) of the protruding portion 183 disposed between the center portions of the two concave portions 181 adjacent to each other along the first direction X and the top portion (or first peak portion) of the protruding portion 183 disposed between the center portions of the two concave portions 181 adjacent to each other in the diagonal direction along the direction of the zigzag line ZL.

The bottom surface of each of the plurality of concave portions 181 may be defined as the non-light-emitting concave area NEA2. In the first inclined portion of the protruding portion 183 surrounding the one concave portion 181, a portion between the non-emission convex area NEA1 and the non-light-emitting concave area NEA2 may be defined as the emission area.

In the light-emitting display device according to an embodiment of the present disclosure, the protruding portion 183 of the light extraction pattern 180 may reflect the light emitted from the light emitting area EA toward the light-emitting surface, thereby improving the light extraction efficiency of the pixel. Accordingly, the non-emission area NEA over the protruding portion 183 according to the thickness of the light-emitting layer EL formed in the protruding portion 183 may affect the light extraction efficiency of the pixel. Thus, the non-emission area NEA over the protruding portion 183 may be a variable that determines luminous efficiency, light extraction efficiency, and current efficiency increase of the pixel (or light-emitting display device).

Figure 5:
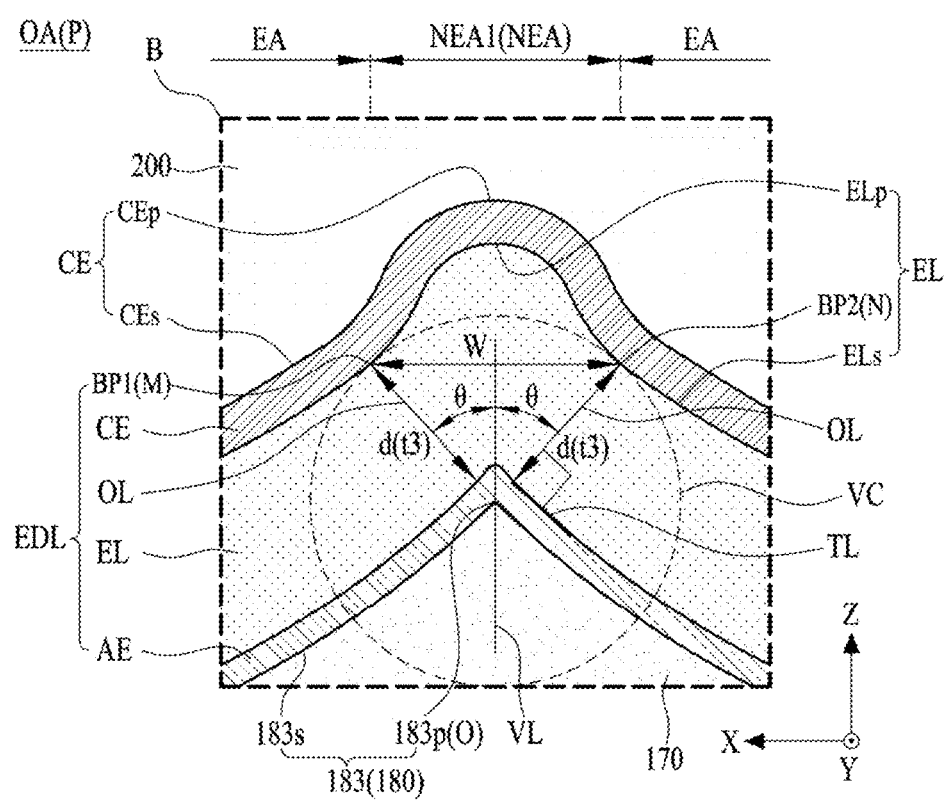
FIG. 5 is an enlarged view of part 'B' illustrated in FIG. 3.

FIG. 5 is an enlarged view of part 'B' illustrated in FIG. 3. FIG. 6 is a photomicrograph illustrating an example of the part B' illustrated in FIG. 3.

FIG. 6 illustrates the non-emission area disposed in the opening area according to an embodiment of the present disclosure. With reference to the examples of FIGS. 3 to 6, in the light-emitting display device according to an embodiment of the present disclosure, the opening area OA of each pixel P may include the non-emission area NEA disposed at a portion of the protruding portion 183 of the light extraction pattern 180. That is, the opening area OA of each pixel P or the light-emitting device layer EDL may include the non-emission convex area NEA1 disposed at a portion of the protruding portion 183 of the light extraction pattern 180.

As an example, the non-emission convex area NEA1 may be an area between a portion having the thinnest thickness t3 of the light-emitting layer EL disposed over the protruding portion 183 and the third top portion ELp. For example, the non-emission convex area NEA1 may be an area between a portion of the third inclined portion ELs of the light-emitting layer EL in which the light-emitting layer may have the third thickness t3 corresponding to the thinnest third thickness t3, and the third top portion ELp in which the light-emitting layer EL may have the first thickness t1.

As an example, the non-emission convex area NEA1 may be an area having an angle within a range of 34 degrees to 60 degrees from the vertical line VL of the top portion of the protruding portion 183 with respect to the vertical line VL passing through the end (or vertex) of the first top portion 183p of the protruding portion 183. As an example, the non-emission convex area NEA1 may correspond to a width W of the third top portion ELp of the light-emitting layer EL disposed over the protruding portion 183. For example, the width W of the non-emission convex area NEA1 may correspond to the maximum width of the third top portion ELp.

As another example, the width W of the non-emission convex area NEA1 may correspond to the shortest distance between one end and the other end of the third top portion ELp connected to the third inclined portion ELs with respect to the first top portion 183p of the protruding portion 183. For example, the width W of the non-emission convex area NEA1 may correspond to the shortest distance between the first boundary portion BP1 between one side of the third top portion ELp and the 3-1 inclined portion, and the second boundary portion BP2 between the other side of the third top portion ELp and the 3-2 inclined portion, with respect to the first top portion 183p.

As another example, the width W of the non-emission convex area NEA1 may be defined as in Equation 1, based on the end (or vertex) of the first top portion 183p of the protruding portion 183.

$$W = 2 \times d \times \sin\theta \quad (1)$$

In Equation 1, 'd' may be defined as any one of the thickness of the light-emitting layer EL in which the current (or charge) flows on the end (or vertex) of the first top portion 183p of the protruding portion 183, the thickness of the thinnest light-emitting layer EL on the protruding portion 183, and the shortest distance between the first electrode AE and the second electrode CE. As an example, may be defined as the shortest distance between the first electrode AE and the second electrode CE in the portion having the third thickness t3, which is the thinnest third thickness t3. As another example, 'd' may be defined as the shortest distance between the first electrode AE and the second electrode CE or the thickness of the light-emitting layer EL based on the direction of the perpendicular line OL perpendicular to the tangential line TL of the portion having the third thickness t3 which is the thinnest third thickness t3.

In Equation 1, '$\theta$' may be defined as an angle of the non-emission area NEA. The angle '$\theta$' may be defined as an angle between the vertical line VL and the perpendicular line OL perpendicular to the tangential line TL of the portion having the third thickness t3 in the light-emitting layer EL. The angle '$\theta$' may be an angle between the boundary BP1 and BP2 between the third top portion ELp and the third inclined portion ELs of the light-emitting layer EL and the vertical line VL.

The angle '$\theta$' of the non-emission convex area NEA1, according to an embodiment of the present disclosure, may be within a range from 34 degrees to 60 degrees. The angle '$\theta$' of the non-emission convex area NEA1, according to another embodiment of the present disclosure, may be within a range from 34 degrees to 50 degrees. For example, when the angle '$\theta$' of the non-emission convex area NEA1 is less than 34 degrees, the first inclined portion 183s of the protruding portion 183 may be gently flattened so that the light emitted from the light-emitting layer EL may not proceed toward the substrate 100, and the total reflection may be repeated, whereby the light extraction efficiency may be reduced. For example, when the angle '$\theta$' of the non-emission convex area NEA1 exceeds 60 degrees, the width W of the non-emission convex area NEA1 may be too large or widened, whereby the area (or size) of the non-emission convex area NEA1 on the protruding portion 183 disposed in the opening area OA may increase, which may deteriorate the luminance of the pixel.

According to an embodiment of the present disclosure, in Equation 1, each of 'd' and '$\theta$' may be defined as follows.

In the following description, 'd' refers to the minimum thickness 'd' of the light-emitting layer EL, and '$\theta$' refers to the angle '$\theta$' of the non-emission convex area NEA1.

With reference to the example of FIG. 6, the minimum thickness 'd' of the light-emitting layer EL may correspond to a length, except for the thickness of the first electrode AE, in a radius of the vertical circle VC contacting the second electrode CE, at an origin point corresponding to an end portion (or vertex) of the first top portion 183p of the protruding portion 183. For example, the minimum thickness 'd' of the light-emitting layer EL may be defined as the thickness t3 of the light-emitting layer EL at the closest distance (or shortest distance) of the distance from the end portion O of the first top portion 183p of the protruding portion 183 to the second electrode CE. Herein, the origin point of the vertical circle VC may be 'O', the intersection point (or contact point) between the vertical circle VC and the perpendicular line OL in one side of the third top portion ELp of the light-emitting layer EL may be 'M', and the intersection point (or contact point) between the vertical circle VC and the perpendicular line OL in the other side of the third top portion ELp of the light-emitting layer EL may be 'N'. The angle '$\theta$' of the non-emission convex area NEA1 may be defined as an angle between the perpendicular line OL and the vertical line VL passing through the end O of the first top portion 13p of the protruding portion 183 (or origin point O of the vertical circle VC) in parallel to the thickness direction Z of the substrate 100.

In an isosceles triangle formed by the origin point O of the vertical circle VC, and the first and second vertices M and N, which correspond to the intersection point (or contact point) of the vertical circle VC and the perpendicular line OL, the charge of the first electrode AE may flow to the portion having the thin thickness of the light-emitting layer EL, whereby the charge in the end O of the first top portion 183p of the protruding portion 183 may flow to each of a first oblique side OM between the origin point O of the isosceles triangle and the first vertex M and a second oblique side ON between the origin point O of the isosceles triangle and the second vertex N. Meanwhile, the charge in the end O of the first top portion 183p of the protruding portion 183 cannot flow to a portion MON between the first vertex M and the second vertex N, in which the light-emitting layer EL may be gradually increased from the third thickness t3 to the first thickness t1, wherein the portion MON of the isosceles triangle may be defined as the non-emission area NEA.

Accordingly, when the angle between the origin point O of the triangle and the first vertex M is '$\theta$', the width W of the non-emission convex area NEA1 may be defined as $2 \times d \times \sin\theta$, such as in Equation 1 above. Because the angle '$\theta$' of the non-emission convex area NEA1 to the protruding portion 183 of the light extraction pattern 180 may vary the width W or the size (e.g., area) of the non-emission convex area NEA1 formed over the protruding portion 183, the light extraction efficiency of the pixel or light-emitting display device including the light extraction pattern 180 may be changed.

Figure 7A:
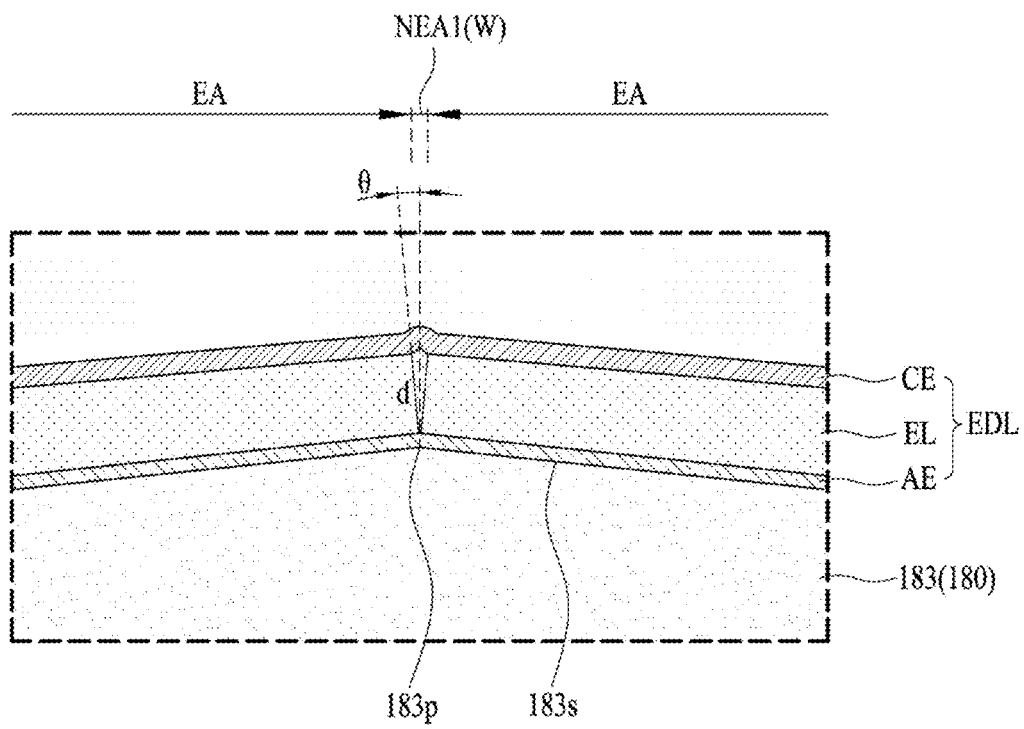
FIGS. 7A to 7C are diagrams for explaining the angle of the first non-emission area according to an embodiment of the present disclosure.
Figure 7B:
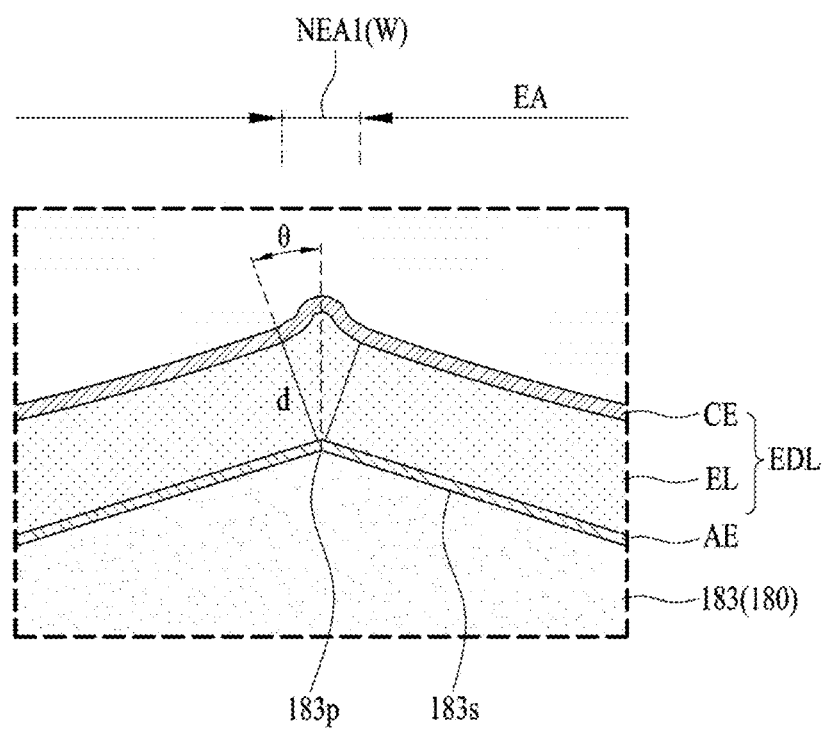
Figure 7C:
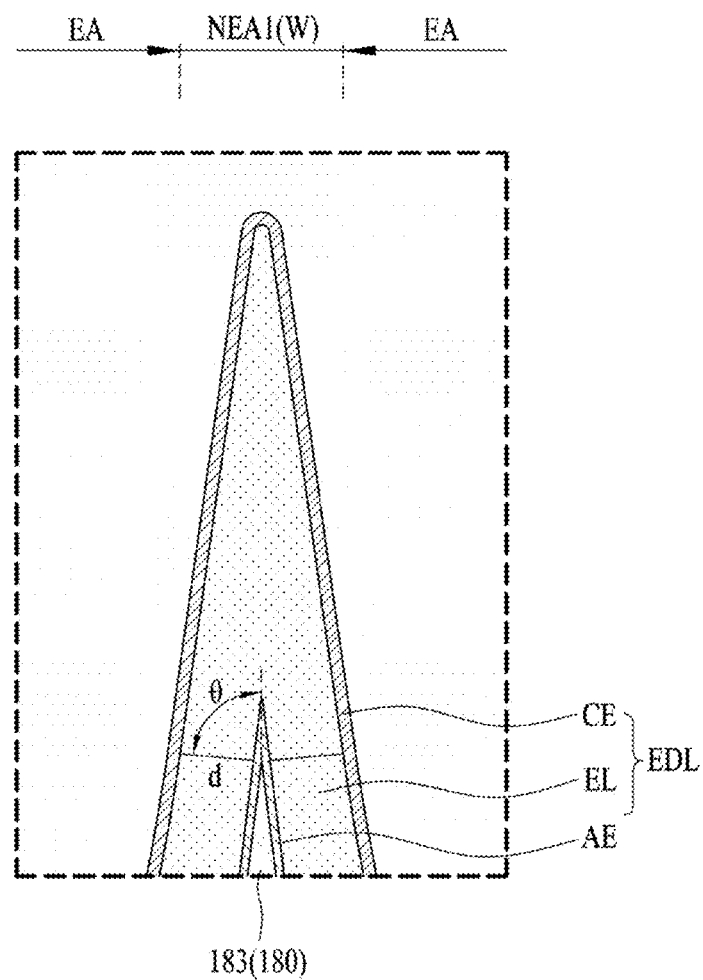

FIGS. 7A to 7C are diagrams for explaining the angle of the first non-emission area according to an embodiment of the present disclosure.

With reference to the example of FIG. 7A, the angle '$\theta$' of the non-emission convex area NEA1, according to an embodiment of the present disclosure, may be set to 5 degrees. In this case, because the first inclined portion 183s of the protruding portion 183 is smoothly flattened and the waveguide is formed, light emitted from the light-emitting layer EL may not proceed toward the substrate 100, and the total reflection may be repeated so that light extraction efficiency may be reduced. Therefore, the width W of the non-emission convex area NEA1 may decrease because the angle 'θ' of the non-emission convex area NEA1 is closer to 0 degrees. However, if the height of the protruding portion 183 is too low or flattened, the light emitted from the light-emitting layer EL may be trapped in the light-emitting layer EL, thereby lowering the light extraction efficiency.

With reference to the example of FIG. 7B, the angle 'θ' of the non-emission convex area NEA1, according to an embodiment of the present disclosure, may be set to 20 degrees. In this case, because the first inclined portion 183s of the protruding portion 183 may have a predetermined slope, the non-emission convex area NEA1 of a predetermined width W may be formed. However, because the protruding portion 183 may not have a sufficient height to advance the light emitted from the light-emitting layer EL toward the substrate 100, there may be a limit to improve light extraction efficiency through the protruding portion 183.

With reference to the example of FIG. 7C, the angle 'θ' of the non-emission convex area NEA1, according to an embodiment of the present disclosure, may be set to 85 degrees. In this case, as the first inclined portion 183s of the protruding portion 183 is formed closer to the vertical, the light extraction efficiency of the light emitted from the light-emitting layer EL may be increased or maximized. However, as the width W of the non-emission convex area NEA1 increases or widens, the luminance of the pixel may be lowered according as the area (or size) of the non-emission convex area NEA1 on the protruding portion 183 disposed in the opening area OA increases. Accordingly, when the angle 'θ' of the non-emission convex area NEA1 is close to 90 degrees, the width W of the non-emission convex area NEA1 may be increased toward or to a maximum, whereby the luminance of the pixel may be lowered.

Accordingly, the angle 'θ' of the non-emission convex area NEA1 may be set to be greater than 0 degrees and less than 90 degrees. For example, in consideration of both the luminance and/or light extraction efficiency of the pixel according to the area (or size) of the first non-emission area formed in the protruding portion 183 disposed in the opening area of the pixel, the angle 'θ' of the non-emission convex area NEA1 may be within a range from 34 degrees to 60 degrees, and more preferably may be within a range from 34 degrees to 50 degrees.

Figure 8A:
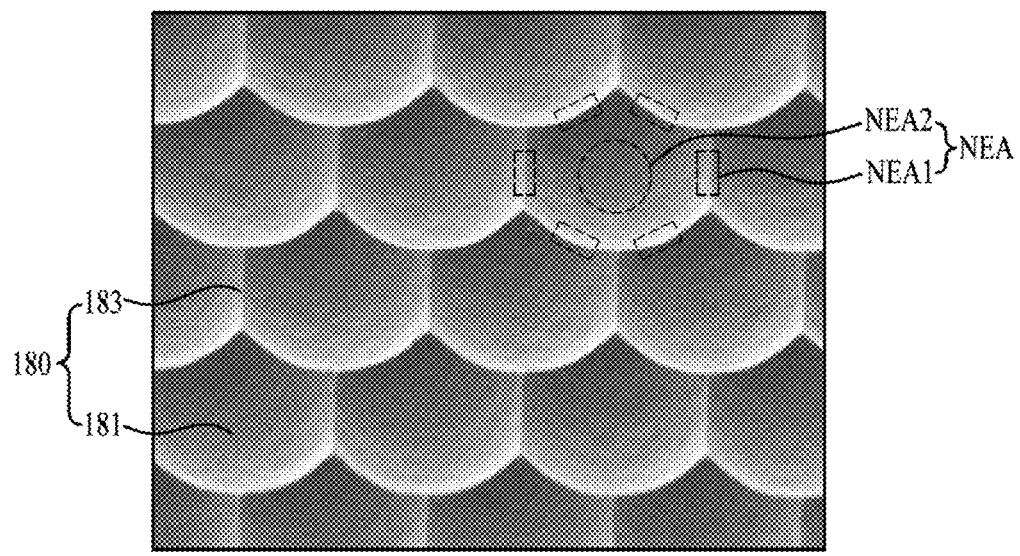
FIG. 8A is a photomicrograph of a non-flat portion of the light-emitting display device according to an embodiment of the present disclosure.
Figure 8B:
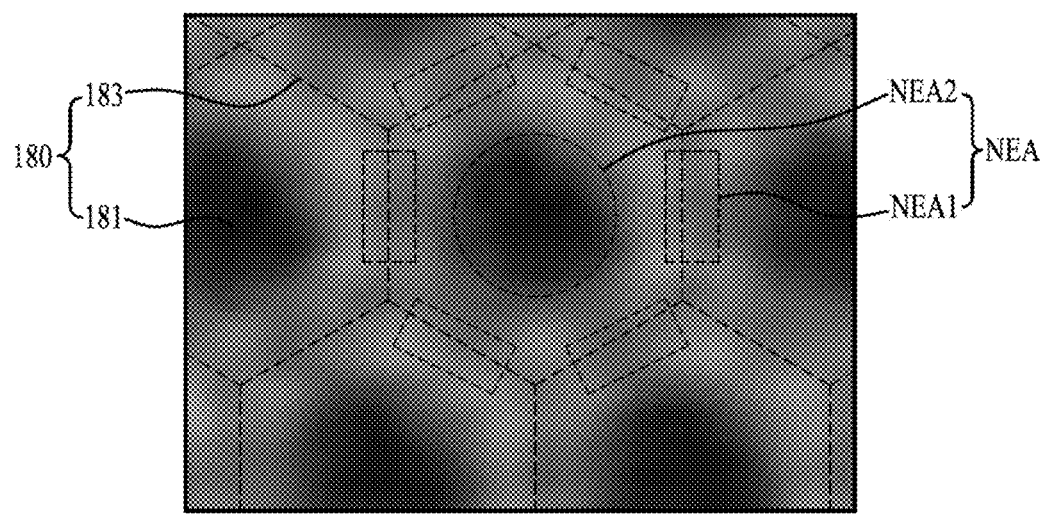
FIG. 8B is a photograph illustrating an actual light-emitting image of the pixel in the light-emitting display device according to an embodiment of the present disclosure.

FIG. 8A is a photomicrograph of a non-flat portion of the light-emitting display device according to an embodiment of the present disclosure. FIG. 8B is a photograph illustrating an actual light-emitting image of the pixel in the light-emitting display device according to an embodiment of the present disclosure.

As shown in the examples of FIGS. 8A and 8B, in the light-emitting display device according to an embodiment of the present disclosure, the light extraction pattern 180 disposed in the opening area OA of each pixel may include the plurality of concave portions 181 and the protruding portion 183 surrounding the plurality of concave portions 181. The opening area OA of each of the pixels may include the non-emission convex area NEA1 corresponding to each side of the protruding portion 183, having a hexagonal shape, disposed between the two adjacent concave portions 181 while surrounding one concave portion 181, and may include the non-light-emitting concave area NEA2 corresponding to the bottom surface of each of the plurality of concave portions 181. Each of the non-emission convex area NEA1 and the non-light-emitting concave area NEA2 may be identical in an actual light-emitting image. For example, in the actual light-emitting image, a gray portion near a black of the protruding portion 183 represents the non-emission convex area NEA1, and a black portion of the concave portion 181 represents the non-light-emitting concave area NEA2.

Figure 9:
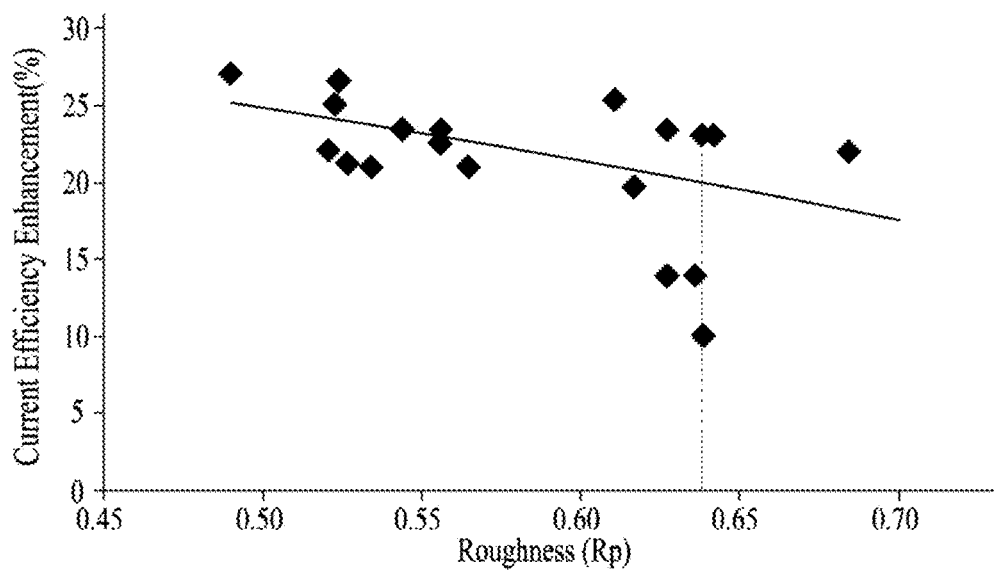
FIG. 9 is a graph illustrating the current efficiency increase rate of the pixel according to a surface roughness of the protruding portion in the light-emitting display device according to an embodiment of the present disclosure.

FIG. 9 is a graph illustrating the current efficiency increase rate of the pixel according to a surface roughness of the protruding portion in the light-emitting display device according to an embodiment of the present disclosure.

FIG. 9 illustrates experimental results of the current efficiency increase rate of the pixel compared to a current efficiency of a related art pixel that does not include a light extraction pattern. In the example of FIG. 9, the surface roughness Rp for the protruding portion is set to the height of the highest protruding portion from the average height of the protruding portion disposed in the reference size (or length) of the light extraction pattern disposed in the opening area of the pixel. As can be seen from FIG. 9, in the pixel of the light-emitting display device according to an embodiment of the present disclosure, when the surface roughness Rp for the protruding portion has a value of approximately 0.5 to 0.7, the current efficiency increase rate is approximately increased by 10% or more compared to the related art pixel.

According to an embodiment of the present disclosure, when the surface roughness Rp for the protruding portion has a value of approximately 0.64, it can be seen that the current efficiency increase rate increases within a range of approximately 10 to 25% as compared to the related art pixel. Accordingly, when all of the pixels or the light-emitting display device have the same value of the surface roughness Rp, a deviation of about 15% occurs between the current efficiency increase rate generated between the pixels or the increase rate of current efficiency generated between the light-emitting display devices, and the surface roughness Rp for the protruding portion may not sufficiently represent the light extraction efficiency and the current efficiency increase rate for the pixel including the light extraction pattern.

Figure 10:
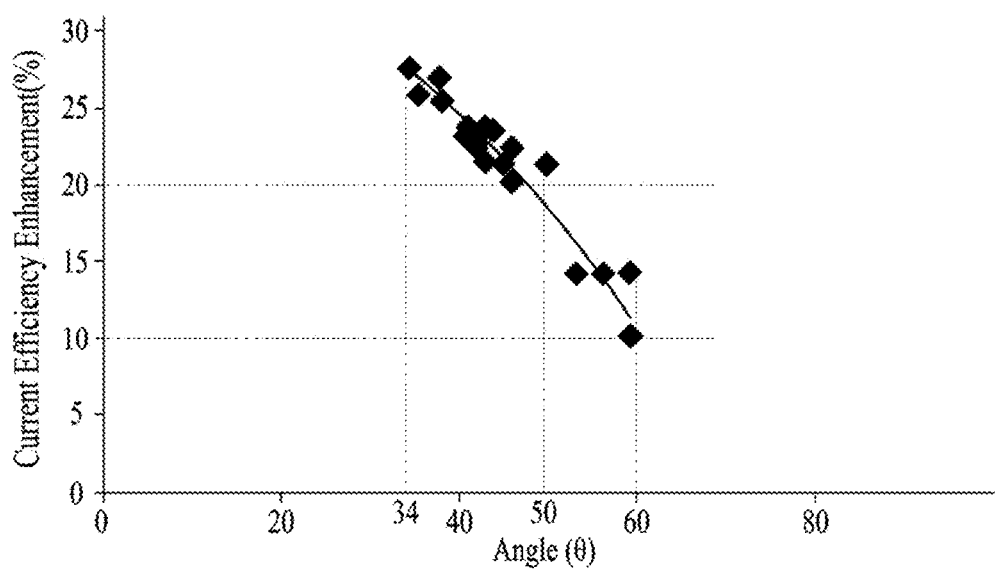
FIG. 10 is a graph illustrating the current efficiency increase rate of the pixel according to an angle of the first non-emission area of the protruding portion in the light-emitting display device according to an embodiment of the present disclosure.

FIG. 10 is a graph illustrating the current efficiency increase rate of the pixel according to an angle of the first non-emission area of the protruding portion in the light-emitting display device according to an embodiment of the present disclosure.

FIG. 10 illustrates experimental results of the current efficiency increase rate of the pixel as compared to a current efficiency of a related art pixel that does not include a light extraction pattern. With reference to the examples of FIGS. 5 and 10, in the pixel of the light-emitting display device according to an embodiment of the present disclosure, when the angle 'θ' of the non-emission convex area NEA1 to the protruding portion has a range of 34 degrees to 60 degrees (34°≤θ≤60°), the current efficiency increase rate increases by about 10% or more as compared to a related art pixel. For example, in the pixel of the light-emitting display device according to an embodiment of the present disclosure, when the angle 'θ' of the non-emission convex area NEA1 to the protruding portion has a range of 34 degrees to 50 degrees (34°≤θ≤50°), the current efficiency increase rate increases by about 20% or more as compared to a related art pixel. At this time, when all of the protruding portions of the pixel or the light-emitting display device have the angle 'θ' of the non-emission convex area NEA1 of the same value, a deviation of about 5% occurs between the current efficiency increase rate generated between the pixels or the increase rate of the current efficiency generated between the light-emitting display devices.

Thus, as compared to the surface roughness Rp, the angle 'θ' of the non-emission convex area NEA1 to the protruding portion may sufficiently represent the light extraction efficiency and current efficiency increase for the pixel including the light extraction pattern. Therefore, it can be seen that the angle of the first non-emission area to the protruding portion according to an embodiment of the present disclosure may represent the light extraction efficiency of the light-emitting display device as compared to the surface roughness Rp for the protruding portion more accurately.

As a result, in the light-emitting display device according to an embodiment of the present disclosure, the angle of the non-emission area to the protruding portion of the light extraction pattern disposed in the opening area of each pixel may be in the range of 34 degrees to 60 degrees, so that it may be possible to improve the luminous efficiency, light extraction efficiency, and current efficiency increase rate of the pixel, thereby improving the luminance and the light extraction efficiency of light emitted from the light-emitting device layer of each pixel and reducing power consumption. With the light-emitting display device according to an embodiment of the present disclosure, it may be possible to enhance light extraction efficiency of light that is emitted from a light-emitting element, to improve luminance, and to decrease power consumption.

The light-emitting display device according to an embodiment of the present disclosure can be applied to various applications. The light-emitting display device according to an embodiment of the present disclosure can be applied to mobile devices, video phones, smart watches, watch phones, wearable devices, foldable devices, rollable devices, bendable devices, flexible devices, curved devices, electronic organizers, electronic books, portable multimedia players (PMPs), personal digital assistants (PDAs), MP3 players, mobile medical devices, desktop personal computers (PCs), laptop PCs, netbook computers, workstations, navigation apparatuses, automotive navigation apparatuses, automotive display apparatuses, TVs, wall paper display apparatuses, signage apparatuses, game machines, notebook computers, monitors, cameras, camcorders, home appliances, etc.

A light emitting display device according to an embodiment of the present disclosure comprises a substrate including a plurality of pixels having an opening area, a light extraction pattern disposed in the opening area and configured to have a plurality of concave portions spaced apart from each other and a protruding portion surrounding each of the plurality of concave portions, and a light emitting device layer having a light emitting layer disposed over the light extraction pattern The light emitting device layer may include a non-emission area overlapped with a top portion of the protruding portion between the two adjacent concave portions.

A light-emitting display device according to another embodiment of the present disclosure comprises a substrate including a plurality of pixels having an opening area, a planarization layer having a light extraction pattern disposed in the opening area and configured to have a plurality of concave portions spaced apart from each other and a protruding portion surrounding each of the plurality of concave portions, a first electrode disposed over the light extraction pattern, a light emitting layer disposed over the first electrode and configured to include a top portion and a curved portion inclined from the top portion, and a second electrode disposed over the light emitting layer.

The opening area may include a non-emission convex area overlapped with the top portion of the light emitting layer.

The above mentioned aspect could be further combined with one or more of the following optional features.

In one or more embodiments, the light emitting layer may include a convex light emitting layer over the sharp portion; and a curved light emitting layer over the inclined portion.

Preferably, the non-emission convex area may be overlapped with the convex light emitting layer.

In one or more embodiments, a width of the non-emission convex area may correspond to a maximum width of the convex light emitting layer.

In one or more embodiments, a width of the non-emission convex area may correspond to the shortest distance between one end and the other end of the convex light emitting layer connected to the curved light emitting layer with respect to the sharp portion.

In one or more embodiments, the non-emission convex area may have a width W defined by the following equation, $W=2 \times d \times \sin\theta$, wherein 'θ' is an angle from 34 degrees to 60 degrees, and 'd' is a thinnest thickness of the light emitting layer, and 'θ' is an angle between a perpendicular line perpendicular to a tangential line of a portion having the thinnest thickness of the light emitting layer and a vertical line passing through the sharp portion.

In one or more embodiments, the light emitting device layer may include a first electrode which is in direct contact with the light extraction pattern; and a second electrode disposed over the first electrode.

In one or more embodiments, the light emitting layer may be interposed between the first electrode and the second electrode.

In one or more embodiments, a light extraction pattern may be disposed in the opening area and configured to have a plurality of concave portions spaced apart from each other and a protruding portion surrounding each of the plurality of concave portions.

In one or more embodiments, the light emitting display device may comprise a first electrode disposed over the light extraction pattern; a light emitting layer disposed over the first electrode and configured to include a top portion and a curved portion inclined from the top portion; and a second electrode disposed over the light emitting layer.

In one or more embodiments, the opening area may include a non-emission convex area overlapped with the top portion of the light emitting layer.

In one or more embodiments, the protruding portion may include a sharp portion having a sharp tip structure.

In one or more embodiments, the protruding portion may include an inclined portion between the sharp portion and a bottom surface of a corresponding concave portion.

In one or more embodiments, the top portion of the light emitting layer may be disposed over the sharp portion.

In one or more embodiments, the curved portion of the light emitting layer is disposed over the inclined portion.

In one or more embodiments, the top portion of the light emitting layer may have a convex curved-line shape over the sharp portion.

In one or more embodiments, a width of the non-emission convex area may correspond to the shortest distance between one end and the other end of the top portion connected to the curved portion with respect to the sharp portion.

In one or more embodiments, in the equation, 'd' may be the thickness of the light emitting layer at the shortest distance from the sharp portion to the second electrode.

In one or more embodiments, the first electrode may be formed in a conformal manner with respect to the light extraction pattern.

In one or more embodiments, the light emitting layer may be formed in a non-conformal manner with respect to the first electrode.

In one or more embodiments, the second electrode may be formed in a conformal manner with respect to the light emitting layer.

In one or more embodiments, the opening area may further include a non-light emitting concave area overlapped with a bottom surface of each of the plurality of concave portions.

In one or more embodiments, the light emitting display device may further comprise a wavelength conversion layer disposed between the substrate and the light extraction pattern.

In one or more embodiments, an arrangement area of the light extraction pattern may be wider than the opening area.

In one or more embodiments, the plurality of concave portions may be arranged in parallel to have a predetermined interval between each other along a first direction.

In one or more embodiments, each of the plurality of concave portions may be alternately arranged along a second direction crossing the first direction.

In one or more embodiments, the protruding portion surrounding one concave portion may have a hexagonal shape in a plan view.

It will be apparent to those skilled in the art that various modifications and variations may be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. A light-emitting display device, comprising:
    a substrate;
    a plurality of pixels on the substrate, each pixel comprising an opening area;
    a light extraction pattern disposed in the opening area, the light extraction pattern comprising:
        a plurality of concave portions spaced apart from each other; and
        a protruding portion surrounding each of the plurality of concave portions; and
    a light-emitting device layer comprising:
        a light-emitting layer over the light extraction pattern; and
        a non-emission area overlapping a peak of the protruding portion between two adjacent concave portions among the plurality of concave portions.

2. The light-emitting display device of claim 1, wherein:
    the protruding portion comprises:
        a sharp portion at the peak and having a sharp tip structure; and
        an inclined portion inclined from the sharp portion; and
    the non-emission area comprises a non-emission convex area overlapping the sharp portion.

3. The light-emitting display device of claim 2, wherein: the light-emitting layer comprises:
    a convex light-emitting layer over the sharp portion; and
    a curved light-emitting layer over the inclined portion; and
    the non-emission convex area overlaps the convex light-emitting layer.

4. The light-emitting display device of claim 3, wherein a width of the non-emission convex area corresponds to a maximum width of the convex light-emitting layer.

5. The light-emitting display device of claim 3, wherein a width of the non-emission convex area corresponds to a shortest distance between one end and another end of the convex light-emitting layer connected to the curved light-emitting layer, with respect to the sharp portion.

6. The light-emitting display device of claim 3, wherein:
    the non-emission convex area has a width W defined by the following equation:

$W = 2 \times d \times \sin\theta$, where '$\theta$' is an angle from 34 degrees to 60 degrees, and
    where '$d$' is a thinnest thickness of the light-emitting layer; and
    '$\theta$' is an angle between a perpendicular line perpendicular to a tangential line of a portion having the thinnest thickness of the light-emitting layer, and a vertical line passing through the sharp portion.

7. The light-emitting display device of claim 6, wherein:
    the light-emitting device layer comprises:
        a first electrode, which is in direct contact with the light extraction pattern; and
        a second electrode over the first electrode; and
    the light-emitting layer is between the first electrode and the second electrode.

8. The light-emitting display device of claim 7, wherein:
    the first electrode has a conformal shape with respect to the light extraction pattern; and
    the light-emitting layer has a non-conformal shape with respect to the first electrode.

9. The light-emitting display device of claim 8, wherein the second electrode has a conformal shape with respect to the light-emitting layer.

10. The light-emitting display device of claim 1, wherein the opening area further comprises a non-light-emitting concave area overlapping a bottom portion of each of the plurality of concave portions in a respective pixel.

11. The light-emitting display device of claim 1, further comprising a wavelength conversion layer between the substrate and the light extraction pattern.

12. The light-emitting display device of claim 1, wherein the light extraction pattern is wider than the opening area.

13. The light-emitting display device of claim 1, wherein:
    the plurality of concave portions are arranged in parallel to have a predetermined interval between each other along a first direction; and
    each of the plurality of concave portions are alternately arranged along a second direction crossing the first direction.

14. The light-emitting display device of claim 1, wherein the protruding portion surrounding one concave portion has a hexagonal shape in a plan view.

15. A light-emitting display device, comprising:
    a substrate;
    a plurality of pixels on the substrate, each pixel comprising an opening area;
    a planarization layer comprising a light extraction pattern disposed in the opening area, the planarization layer comprising:
        a plurality of concave portions spaced apart from each other; and
        a protruding portion surrounding each of the plurality of concave portions;
    a first electrode over the light extraction pattern;

a light-emitting layer over the first electrode, the light-emitting layer comprising:
- a top portion overlapping a peak of the protruding portion; and
- a curved portion inclined from the top portion; and a second electrode over the light-emitting layer, wherein the opening area comprises a non-emission convex area overlapping the top portion of the light-emitting layer and the peak of the protruding portion.

16. The light-emitting display device of claim 15, wherein:

the protruding portion comprises:
- a sharp portion at the peak and comprising a sharp tip structure; and
- an inclined portion between the sharp portion and a bottom portion of an adjacent concave portion among the plurality of concave portions;

the top portion of the light-emitting layer is disposed over the sharp portion; and the curved portion of the light-emitting layer is disposed over the inclined portion.

17. The light-emitting display device of claim 16, wherein the top portion of the light-emitting layer has a convex curved-line shape over the sharp portion.

18. The light-emitting display device of claim 16, wherein a width of the non-emission convex area corresponds to a shortest distance between one end and another end of the top portion connected to the curved portion, with respect to the sharp portion.

19. The light-emitting display device of claim 16, wherein:

the non-emission convex area has a width W defined by the following equation:

$$W = 2 \times d \times \sin\theta,$$

where '$\theta$' is an angle from 34 degrees to 60 degrees, and where 'd' is the thinnest thickness of the light-emitting layer; and '$\theta$' is an angle between a perpendicular line perpendicular to a tangential line of a portion comprising the thinnest thickness of the light-emitting layer, and a vertical line passing through the sharp portion.

20. The light-emitting display device of claim 15, wherein:

the plurality of concave portions are arranged in parallel to have a predetermined interval between each other along a first direction and each of the plurality of concave portions are alternately arranged along a second direction crossing the first direction.

\* \* \* \* \*